(12) United States Patent
Pan et al.

(10) Patent No.: US 9,190,622 B2
(45) Date of Patent: Nov. 17, 2015

(54) HYBRID AMBIPOLAR TFTS

(75) Inventors: Junyou Pan, Frankfurt am Main (DE); Andreas Klyszcz, Darmstadt (DE); Sabine Renker, Russelsheim (DE)

(73) Assignee: Merck Patent GmbH, Darmstadt (DE)

( * ) Notice: Subject to any disclaimer, the term of this patent is extended or adjusted under 35 U.S.C. 154(b) by 29 days.

(21) Appl. No.: 14/119,889

(22) PCT Filed: May 5, 2012

(86) PCT No.: PCT/EP2012/001945
§ 371 (c)(1),
(2), (4) Date: Nov. 25, 2013

(87) PCT Pub. No.: WO2012/163464
PCT Pub. Date: Dec. 6, 2012

(65) Prior Publication Data
US 2014/0091300 A1   Apr. 3, 2014

(30) Foreign Application Priority Data

Jun. 1, 2011 (EP) .................... 11004510

(51) Int. Cl.
*H01L 35/24* (2006.01)
*H01L 51/05* (2006.01)
*H01L 51/00* (2006.01)

(52) U.S. Cl.
CPC ........ *H01L 51/0504* (2013.01); *H01L 51/0003* (2013.01); *H01L 51/0562* (2013.01); *H01L 51/0039* (2013.01); *H01L 51/0059* (2013.01)

(58) Field of Classification Search
CPC ............ H01L 51/0067; H01L 51/0072; H01L 51/5044; H01L 51/506; H01L 51/5265; H01L 51/5268; H01L 51/5278; H01L 51/5068; H01L 51/5064; H01L 51/0085; H01L 51/0071; H01L 51/5218; H01L 51/0061; H01L 51/0052; H01L 51/5092; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS

| 7,935,961 | B2 | 5/2011 | Lee et al. |
|---|---|---|---|
| 8,071,976 | B2* | 12/2011 | Huang et al. .................... 257/40 |
| 8,686,404 | B2* | 4/2014 | Kagan et al. .................... 257/40 |
| 2007/0187674 | A1* | 8/2007 | Nakamura et al. .............. 257/40 |
| 2009/0101891 | A1 | 4/2009 | Moon et al. |
| 2012/0140599 | A1 | 6/2012 | Liao |

OTHER PUBLICATIONS

International Search Report from PCT/EP2012/001945 dated Jul. 27, 2012.

(Continued)

*Primary Examiner* — Dung Le
(74) *Attorney, Agent, or Firm* — Millen, White, Zelano & Branigan, P.C.

(57) ABSTRACT

The present invention relates inter alia to an electronic device, preferably a thin film transistor (TFT) comprising layers with n-type and p-type semi conducting materials, wherein the p-type layer comprises at least one organic hole transport material. Furthermore, the present invention relates to the use of the electronic device according to the invention in an electronic equipment selected from an RFID and backplanes for a display, electronic book and electronic paper, and an electronic equipment comprising an electronic device according to the invention.

14 Claims, 3 Drawing Sheets

(56) References Cited

OTHER PUBLICATIONS

Maria S. Hammer, et al. "Effect of doping of zinc oxide on the hole mobility of poly(3-hexylthiophene) in hybrid transistors" Organic Electronics, vol. 11, No. 9, [Sep. 2010], pp. 1569-1577.

M. Yoshida, et al. "Sub-threshold behavior in nanoparticle-dispersed poly(3-hexylthiophene) FET" Proceedings of SPIE, vol. 5522, [Aug. 2004], pp. 89-96.

Zhang Zhilin et al. "Energy transfer and white emitting organic thin film electroluminescence" Thin Solid Films, vol. 363, No. 1-2, [Mar. 2000], pp. 61-63.

* cited by examiner

HYBRID AMBIPOLAR TFTS

The present invention relates to an electronic device, preferably a hybrid ambipolar thin film transistor (TFT), comprising arranged on a substrate (5) a semiconductor body which comprises a n-type layer ((1) or (2)) and a p-type layer ((2) or (1)) comprising an organic p-type material, a first electrode (4), an insulating layer A (6) interposed between the semiconductor body and the first electrode, a second electrode (3) which is in contact with the semiconductor body and a third electrode (7) which is in contact with the semiconductor body but is detached from the second electrode (3). The electronic device according to the invention is characterized in that the semiconductor body further comprises an insulating layer B (8) interposed between the n-type layer and the p-type material layer, and/or in that the n-type layer comprises an inorganic n-type material and the p-type layer comprising an organic p-type material having a lowest unoccupied molecule orbital (LUMO) at an energy level higher than $-2.7$ eV. Furthermore, the present invention relates to a process of production of an electronic device according to the invention wherein the organic p-type layer is coated from solution. Another embodiment of the present invention is the use of the electronic device according to the invention in an electronic equipment selected from an RFID (Radio Frequency Identification) and backplanes for a display, such as LCD (liquid crystal display), OLED, electronic book and electronic paper, an electronic equipment comprising an electronic device according to the invention.

Printed electronics, such as organic photovoltaic cells (OPVs), organic light emitting diodes (OLEDs) and organic thin-film transistors (TFTs) have drawn much attention since last decade, because they can be produced by printing technology, which reduces costs for mass production significantly. Printed TFTs are of particular commercial interest, because they can be potentially used in displays, RFIDs (radio frequency identification devices), in backplanes for display application, electronic books and electronic papers.

Among TFTs, ambipolar TFTs are attractive because unlike unipolar TFTs, they operate independently of the sign of the gate voltage (Meijer, E. J.; de Leeuw, D. M.; Setayesh, S.; van Veenendaal, E.; Huisman, B.-H.; Blom, P. W. M.; Hummelen, J. C.; Scherf, U.; Klapwijk, T. M. Solution-processed ambipolar organic field-effect transistors and inverters (Nat Mater 2003, 2 (10), 678-682). When used in complementary circuits, this intrinsic characteristic can 1) simplify the circuit design by reducing the number of control lines and enable circuits with multifunctional operation, and 2) reduce the area of TFTs in display, thus enlarging the aperture of the display. For example, a single digital circuit functioning as a logic gate can adaptively operate like two logic gates (i.e. NOR and NAND) depending upon the polarity of the input signals (Yu, W. J.; Kim, U. J.; Kang, B. R.; Lee, I. H.; Lee, E. H.; Lee, Y. H. Adaptive Logic Circuits with Doping-Free Ambipolar Carbon Nanotube Transistors. Nano Letters 2009, 9 (4), 1401-1405). So far, different approaches have been developed to realize ambipolar TFTs:

(1) In a first approach a single layer of a neat semiconductor capable of transporting both holes and electrons is used (Anthopoulos, T. D.; Setayesh, S.; Smits, E.; Colle, M.; Cantatore, E.; de Boer, B.; Blom, P. W. M.; de Leeuw, D. M. Air-stable complementary-like circuits based on organic ambipolar transistors. Adv. Mater. (Weinheim, Ger.) 18[14], 1900-1904, 2006);

(2) In a second approach a blend of p- and n-type semiconductors is employed (Zaumseil, J.; Sirringhaus, H. Electron and Ambipolar Transport in Organic Field-Effect Transistors. Chemical Reviews 2007, 107 (4), 1296-1323); or (3) In a third approach a bilayer of two vertically stacked semiconductors is used (Zaumseil, J.; Sirringhaus, H. Electron and Ambipolar Transport in Organic Field-Effect Transistors, Chemical Reviews 2007, 107 (4), 1296-1323; Dhananjay; Ou, C. W.; Yang, C. Y.; Wu, M. C.; Chu, C. W. Ambipolar transport behavior in $In_2O_3$/pentacene hybrid heterostructure and their complementary circuits, Applied Physics Letters 2008, 93 (3), 033306-1-033306/3; Pal, B. N.; Trottman, P.; Sun, J.; Katz, H. E. Solution-deposited zinc oxide and zinc oxide/pentacene bilayer transistors: high mobility n-channel, ambipolar, and nonvolatile devices. Adv. Funct. Mater. 2008, 18 (12), 1832-1839; Nakanotani, H.; Yahiro, M.; Adachi, C.; Yano, K. Ambipolar field-effect transistor based on organic-inorganic hybrid structure. Applied Physics Letters 2007, 90 (26), 262104).

However, as compared to their unipolar counterparts, all of those ambipolar TFTs showed low performance due to either unbalanced charge injection, or to the adverse effects arising from the existence of a p-n heterojunction both in blended layer and bilayer.

It is also well-known that there are plenty of stable inorganic n-type materials, for example ZnO and $In_2O_3$, and many stable p-type organic materials as well, for example triarylamine derivatives. Both are independently included in xerographic systems since several decades. Therefore, it is highly desired to make use of the advantages of both systems. So far, several types of hybrid ambipolar TFTs have been exploited.

Dhananjay et al., reported a hybrid ambipolar TFT comprising $In_2O_3$/pentacene (Dhananjay; Ou, C. W.; Yang, C. Y.; Wu, M. C.; Chu, C. W. Ambipolar transport behavior in $In_2O_3$/pentacene hybrid heterostructure and their complementary circuits. Applied Physics Letters 2008, 93 (3), 033306-1-033306/3) wherein both $In_2O_3$ and pentacene layers were evaporated, and the $In_2O_3$ layer was heat-treated at 750° C., which isn't applicable to a flexible substrate.

Pal et al., reported a Zinc Oxide/Pentacene Bilayer ambipolar transistors, wherein the ZnO layer was obtained by heating the precursor zinc acetate $[Zn(OAc)_2]$ for 15 min. at 500° C., which is again not suitable for flexible substrates due to the decomposition temperature of organic polymeric substrates usually used as flexible substrates.

Adachi group disclosed similar hybrid ambipolar TFTs, based on indium zinc oxide/pentacene.

All of these ambipolar TFTs use pentacene derivates as p-type materials, and showed a quite low On/Off ratio. In an ideal case, p-channel cannot get and transport electrons and n-channel not get and transport holes. Pentacene derivates are typically p-type materials, but have a quite low LUMO, as shown for example by Kim et al (Kim, C.; Huang, P. Y.; Jhuang, J. W.; Chen, M. C.; Ho, J. C.; Hu, T. S.; Yan, J. Y.; Chen, L. H.; Lee, G. H.; Facchetti, A.; Marks, T. J. Novel soluble pentacene and anthradithiophene derivatives for organic thin-film transistors. Organic Electronics 2010, 11 (8), 1363-1375), which makes electron injection into p-channel possible.

It was therefore an object of the present invention to provide electronic devices, in particular ambipolar TFTs, which make use of the advantages of hybrid ambipolar devices and which can show a higher On/Off ratio than the hybrid ambipolar devices known in the state of the art.

The inventors of the present invention have surprisingly found that the before-mentioned object may be solved either by using p-type materials having a high lowest unoccupied molecule orbital (LUMO) or by using a insulating layer between the n-type layer and the p-type layer. In the first case the so-called n-channel of the n-type layer will not or less be influenced by the possible electron transport into the so-called p-channel of the p-type layer. In the second case the separating insulating layer physically separates the n- and p-channel, thereby giving the possibility to separately optimize the p-channel and to reduce the leakage of electrons into the p-channel. Both embodiments leading to an electronic device having an improved On/Off ratio.

The present invention provides an electronic device comprising arranged on a substrate (5):
  (a) a semiconductor body comprising an n-type layer (1, 2) and a p-type layer (1,2), wherein one of the layer (1) or (2) is a n-type and the other one is a p-type layer and wherein the said p-type layer comprises at least one organic hole transport material (HTM);
  (b) a first electrode (4);
  (c) an insulating layer A (6) interposed between the semiconductor body and the first electrode;
  (d) a second electrode (3) which is in contact with the semiconductor body; and
  (e) a third electrode (7) which is in contact with the semiconductor body but is detached from the second electrode.

In a first embodiment of the present invention the n-type layer comprises an inorganic n-type semiconductor material and the p-type layer comprising a organic p-type material having a LUMO higher than −2.7 eV, preferably higher than −2.6 eV and more preferably higher than −2.5 eV.

Phrases like "LUMO higher than" are to be understood herein in the context of absolute energy differences, rather than distances from vacuum level. Thus, a LUMO level of −2.2 eV is considered to be higher as compared to a LUMO level of −2.7 eV, for instance.

In the context of the present invention, the conduct band has the same meaning as LUMO, whereas the former is preferably used for inorganic semiconductors, and the latter is preferably used for organic materials; and the valence band has the same meaning as HOMO (highest occupied molecular orbital), whereas the former is preferably used for inorganic semiconductors, and the latter preferably for organic materials. Nevertheless, conduct band can also be used to describe the LUMO level and valence band can also be used to describe the HOMO level.

In a second embodiment of the present invention the semiconductor body of the electronic device according to the invention further comprises an insulating layer B (8) interposed between the n-type layer and the p-type layer.

It is furthermore an embodiment of the present invention wherein the features characterizing the first and the second embodiment are combined in one electronic device according to the invention.

Furthermore, all preferred embodiments of the present invention refer to the first and the second embodiment or a combination thereof, unless stated otherwise.

A semiconductor body of the present invention is preferably a body comprising at least two layers, namely the organic p-type layer and the n-type layer. In the first embodiment of the present invention it is preferred that the semiconductor body is consisting of the organic p-type layer and the n-type layer. In the second embodiment the semiconductor body further comprises the insulating layer B (8); it is then even more preferred that the semiconductor body is consisting of the organic p-type layer, the n-type layer and the insulating layer B (8).

In embodiments described herein, the substrate may be rigid or flexible. It may be transparent, translucent, opaque or reflective. The materials used can be glass, plastic, ceramic or metal foils, where plastic and metal foils are preferably used for flexible substrates. However, semiconductor materials, such as, for example, silicone wafers or printed circuit board (PCB) materials, can also be employed in order to simplify the generation of conductor tracks. Other substrates can also be employed.

The glass used can be, for example, soda-lime glass, Ba- or Sr-containing glass, lead glass, aluminium silicate glass, borosilicate glass, Ba borosilicate glass or quartz.

The substrate is preferably a flexible substrate which means that it may be bent to a certain degree without destroying the substrate. The substrate is preferably in the form of a thin film which is of a transparent material. The suitable substrate is preferably selected from films or foils based on polymers or plastics. The selection criterion for polymers or plastics are 1) hygienic property and 2) glass transition temperature. The glass transition temperature ($T_g$) of polymers can be found in typical handbooks, for example in "Polymer Handbook", Eds. J. Brandrup, E. H. Immergut, and E. A. Grulke, John Willey & Sons, Inc., 1999, VI/193-VI/276. Preferably, $T_g$ of polymer is above 100° C., very preferably above 150° C., and particularly above 180° C. Very preferred substrates are for example, poly(ethylene terephthalate) (PET) and poly(ethylene 2,6-naphthalate) (PEN).

Further examples for transparent films, but not limited to, are polyethylene, ethylene-vinyl acetate copolymers, ethylene-vinyl alcohol copolymers, polypropylene, polystyrene, polymethyl methacrylate, PVC, polyvinyl alcohol, polyvinylbutyral, nylon, polyether ether ketone, polysulfone, polyether sulfone, tetrafluoroethylene-perfluoroalkyl vinyl ether copolymers, polyvinyl fluoride, tetrafluoroethylene-ethylene copolymers, tetrafluoroethylene-hexafluoropropylene copolymers, polychlorotrifluoroethylene, polyvinylidene fluoride, polyester, polycarbonate, polyurethanes, polyimide or polyether imide.

The electronic devices according to the first and the second embodiment of the present invention may be a so-called bottom gate or a so-called top gate device.

In the bottom gate devices the first electrode (4) is preferably located directly on the substrate (5) in the form of a layer. On the first electrode layer (4) is then preferably located the insulating layer A (6). On the insulating layer A (6) is then preferably located the semiconductor body ((1), (2)). The second (3) and the third electrode (7) are preferably located on two different sides of the semiconductor body ((1), (2)). Such bottom gate devices are shown in FIGS. 1 and 3.

In top gate devices the semiconductor body ((1), (2)) is preferably located on the substrate (5). On the semiconductor body ((1), (2)) is then preferably located the insulating layer A (6). On this insulating layer is then preferably located the first electrode in the form of a layer (4). The second (3) and third (7) electrodes are preferably located on two other outer opposite sides of the semiconductor body ((1), (2)). Such top gate devices are shown in FIGS. 2 and 4.

A n-type layer is a layer capable of transporting electrons. The n-type layer comprises at least one n-type material. This material can be selected from n-type inorganic semiconductor and organic electron transporting material (ETM). In the context of the present invention, n-type material has the same meaning as electron transport material. Suitable n-type materials and their properties are described below.

A p-type layer is a layer capable of transporting holes. The p-type layer comprises at least one p-type material. This material can be selected from p-type inorganic semiconductor and organic hole transporting material (HTM). In the context of the present invention, p-type material has the same meaning as hole transport material. Suitable p-type materials and their properties are described below.

The first (4), second (3) and third (7) electrode may be any kind of electrode suitably for the purposes of an electronic device. The electrodes may work as gate, drain or source which are well known to one skilled in the art. In the present invention the first electrode (4) is thereby usually the gate, and the second (3) and third (7) electrodes are usually the source and the drain, respectively. Specific materials for the electrodes are described below.

In the electronic devices of the present invention the p-type layer is preferably coated from solution. The techniques of coating a film from solution are well known to a person skilled in the art. Preferred deposition techniques from solution include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing, slot-die coating. Ink-jet printing is particularly preferred as it allows high resolution pattern to be prepared without mask. Thereby the material is solved in a solvent and then applied—by one of the methods described above—applied to the substrate or one of the above-described layers deposited on the substrate. Suitable solvents for the organic p-type materials include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

In order to be applied by ink jet printing or microdispensing, the organic p-type material should be first dissolved in a suitable solvent. Solvents must fulfill the requirements stated above and must not have any detrimental effect on the chosen print head. Additionally, solvents should have boiling points >100° C., preferably >140° C. and particularly preferably >150° C. in order to prevent operability problems caused by the solution drying out inside the print head. Beside the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

In the same way as the p-type layer can be coated from the solution, the n-type layer may also be coated from solution. In the present invention it is possible that only one of the layers, preferably the p-type layer, or both the p- and n-type layer may be coated from solution. It is particularly preferred that both layers are coated from solution. Suitable solvents for producing a solution of the n-type material to be applied to form a layer are as described above.

The major advantage of coating the n- and p-type layers from solution is that such a method is very low in costs so that it is possible to reduce costs in mass production of electronic devices.

It is preferred that the organic p-type material is either a polymer (including dendrimer and oligomer) or a small molecule having a molecular weight in the range of from 100 to 3000 g/mol, preferably in the range of from 200 to 2000 g/mol.

If the p-type material is a polymer it is further preferred if the polymer is a copolymer of a backbone monomer unit and a hole transport monomer unit.

In principle any hole transport materials (HTMs) known to one skilled in the art of OLEDs can be employed as organic p-type material in the semiconductor body ((1), (2)) of the present invention. Further to HTMs mentioned elsewhere herein, the HTM preferably comprises a group selected from amines, triarylamines, phthalocyanines, porphyrines, thiophenes, carbazoles, indenocarbazoles, indolocarbazoles, isomers and derivatives thereof. Particularly preferably, the HTM comprises a group selected from amines, triarylamines.

Preferably the organic p-type layer of the present invention comprises three, particularly preferably two, and very particularly preferably one HTM(s). The HTMs may be small molecules (single compounds) or may be part of a polymer in the main chain or in the side chain.

Suitable HTMs are phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717,462), stilbene derivatives (JP A 61-210363), silazane derivatives (U.S. Pat. No. 4,950,950), polysilanes (JP A 2-204996), aniline copolymers (JP A 2-282263), thiophene oligomers, polythiophenes, PVK, polypyrroles, polyanilines and further copolymers, porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), and monomeric triarylamines (U.S. Pat. No. 3,180,730). Even more triarylamino groups may also be present in the molecule.

With respect to organic p-type materials preference is given to aromatic tertiary amines containing at least two tertiary amine units (U.S. Pat. No. 4,720,432 and U.S. Pat. No. 5,061,569), such as, for example, 4,4'-bis[N-(1-naphthyl)-N-phenylamino]biphenyl (NPD) (U.S. Pat. No. 5,061,569) or MTDATA (JP A 4-308688), N,N,N',N'-tetra(4-biphenyl)diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N,N-di(p-tolyl)amino]phenyl]vinyl]-benzene (BDTAPVB), N,N,N',N'-tetra-p-tolyl-4,4'-diaminobiphenyl (TTB), TPD, N,N,N',N'-tetraphenyl-4,4'''-diamino-1,1':4':4'',1'''-quaterphenyl, likewise tertiary amines containing carbazole units, such as, for example, 4 (9H-carbazol-9-yl)-N,N-bis[4-(9H-carbazol-9-yl)phenyl]benzeneamine (TCTA). Preference is likewise given to hexaazatriphenylene compounds in accordance with US 2007/0092755 A1. Particular preference is given to the following triarylamine compounds of the formulae (1) to (15), which may also be substituted, and as disclosed in EP 1162193 A1, EP 650955 A1, Synth. Metals 1997, 91(1-3), 209, DE 19646119 A1, WO 2006/122630 A1, EP 1860097 A1, EP 1834945 A1, JP 08053397 A, U.S. Pat. No. 6,251,531 B1, and WO 2009/041635.

Formula (1)
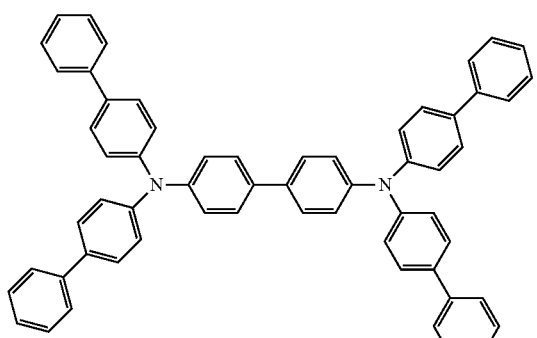
Formula (2)
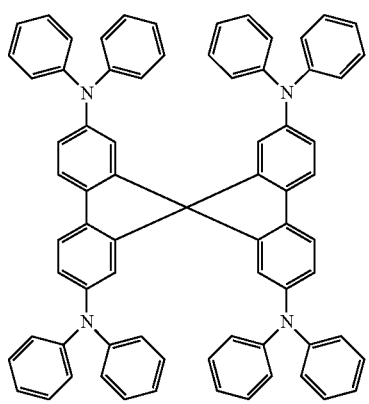
Formula (3)
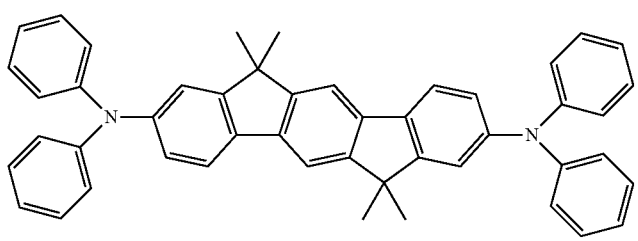
Formula (4)
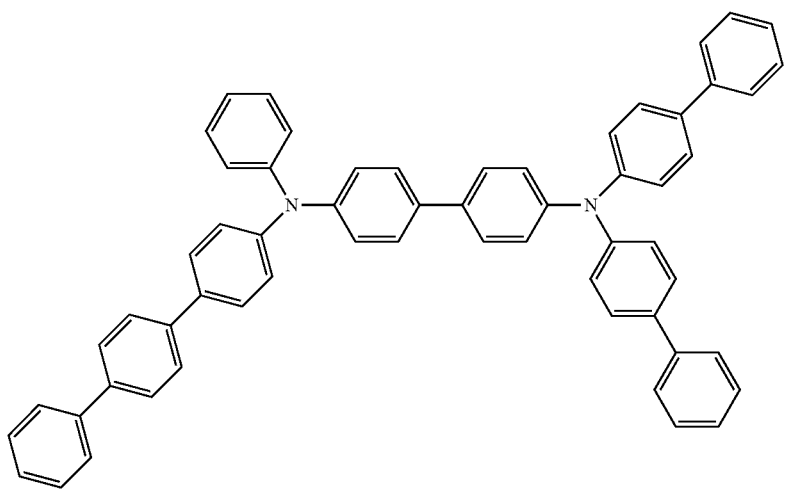
Formula (5)
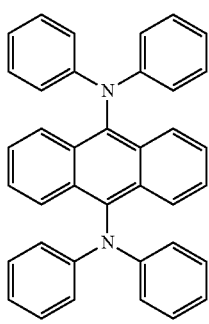
Formula (6)
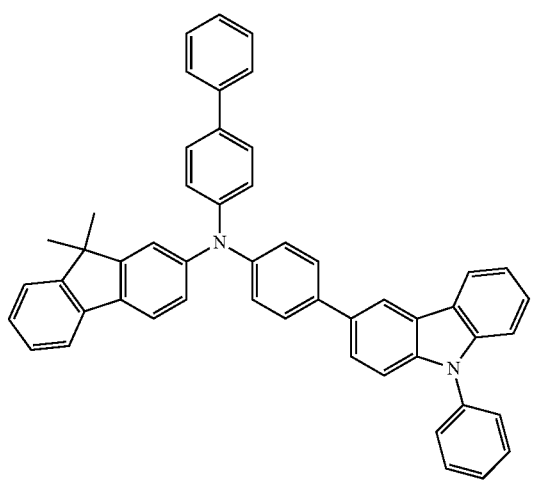

Formula (7)
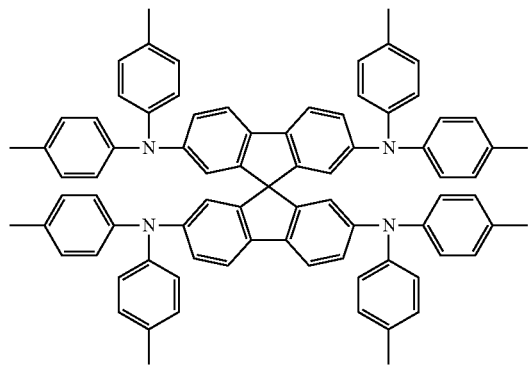
Formula (8)
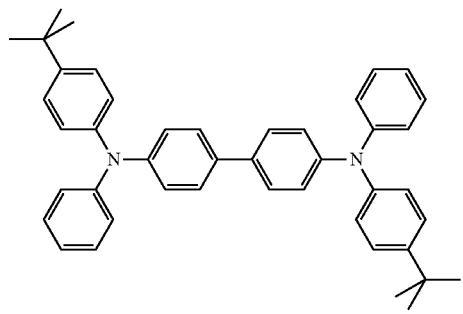
Formula (9)
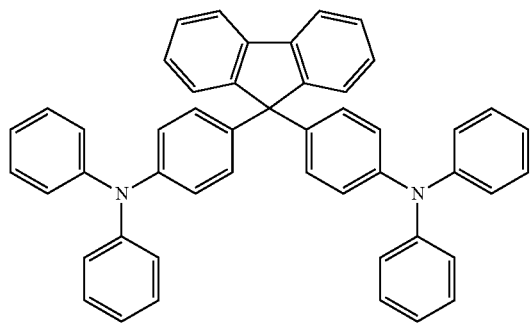
Formula (10)
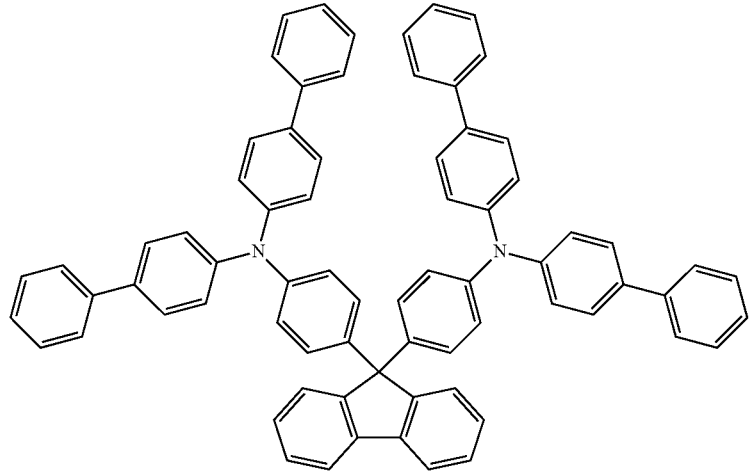
Formula (11)
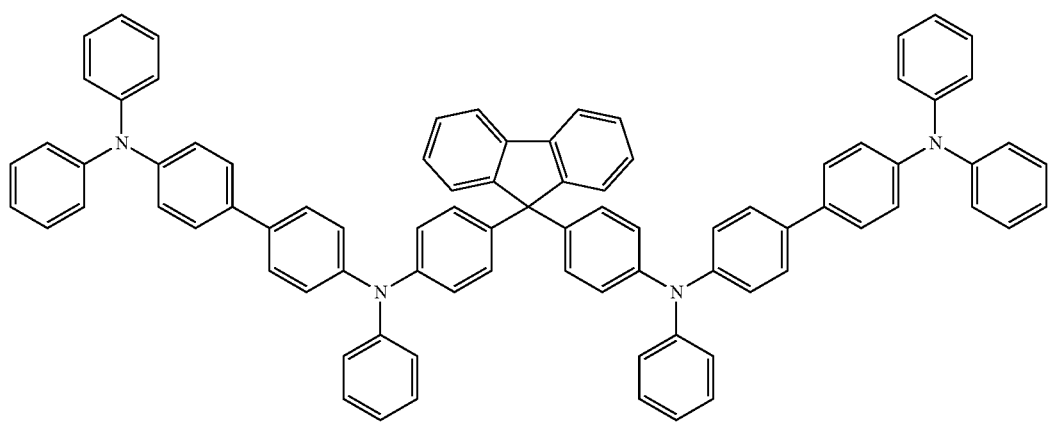

In a certain embodiment, hole injection materials (HIMs) known to one skilled in the art of OLEDs can also be employed as organic p-type material in the semiconductor body of the present invention.

Suitable HIMs are triazole derivatives (U.S. Pat. No. 3,112,197), oxazole derivatives (U.S. Pat. No. 3,257,203), oxadiazole derivatives (U.S. Pat. No. 3,189,447), imidazole derivatives (JP Showa 37 (=1962) 16096), imidazolones, imidazole thiones, tetrahydro-imidazoles, polyarylalkane derivatives (U.S. Pat. No. 3,615,402), pyrazoline and pyrazolone derivatives (U.S. Pat. No. 3,180,729 and U.S. Pat. No. 4,278,746), phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP Showa 54 (1979) 110837), hydrazone derivatives (U.S. Pat. No. 3,717,462), acylhydrazones, stilbene derivatives (JP Showa 61 (1986) 210363), silazane derivatives (U.S. Pat. No. 4,950,950), polysilane compounds (JP Heisei 2 (1990) 204996), PVK and other electrically conductive macromolecules, aniline-based copolymers (JP Heisei 2 (1990) 282263), electrically conductive, macromolecular thiophene oligomers (JP Heisei 1 (1989) 211399), PEDOT:PSS (spin-coated polymer), plasma-deposited fluoro-carbon polymers (U.S. Pat. No. 6,127,004, U.S. Pat. No. 6,208,075, U.S. Pat. No. 6,208,077), porphyrin compounds (JP Showa 63 (1988) 2956965, U.S. Pat. No. 4,720,432), aromatic tertiary amines and styrylamines (U.S. Pat. No. 4,127,412), triphenylamines of the benzidine type, triphenylamines of the styrylamine type, and triphenylamines of the diamine type. Arylamine dendrimers can also be used (JP Heisei 8 (1996) 193191), as can phthalocyanine derivatives, naphthalocyanine derivatives, or butadiene derivatives, and quinoline derivatives, such as, for example, dipyrazino[2,3f:2',3'h]quinoxaline hexacarbonitrile, are also suitable.

Particular preference is given to the tertiary aromatic amines as disclosed in US 2008/0102311 A1, for example N,N'-diphenyl-N,N'-di(3-tolyl)benzidine (=4,4'-bis[N-3-methylphenyl]-N-phenylamino)biphenyl (NPD) (U.S. Pat. No. 5,061,569), N,N'-bis(N,N'-diphenyl-4-aminophenyl)-N,N-diphenyl-4,4'-di¬ amino-1,1'-biphenyl (TPD 232) and =4,4', 4"-tris[3-methylphenyl)phenylamino]-triphenylamine (MTDATA) (JP Heisei 4 (1992) 308688) or phthalocyanine derivatives (for example $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O—GaPc).

Another particular preference is given to the following triarylamine compounds of the formulae (12) (TPD 232), (13), (14), and (15), which may also be substituted, and further compounds as disclosed in U.S. Pat. No. 7,399,537 B2, US 2006/0061265 A1, EP 1661888 B1, and JP 08292586A.

Further HIM compounds suitable as p-type material are disclosed in EP 0891121 A1 and EP 1029909 A1. HIMs and hole injection layers (HILs) in general are described in US 2004/0174116.

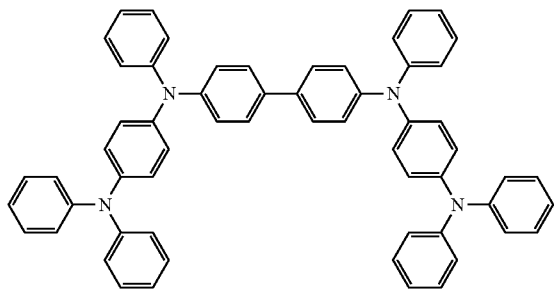

Formula (12)

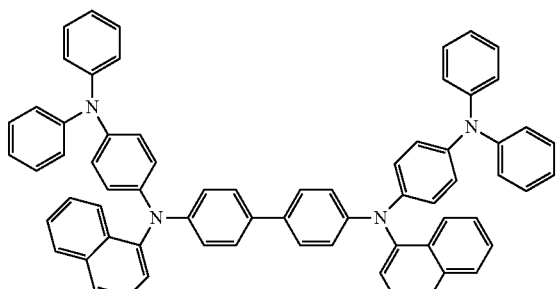

Formula (13)

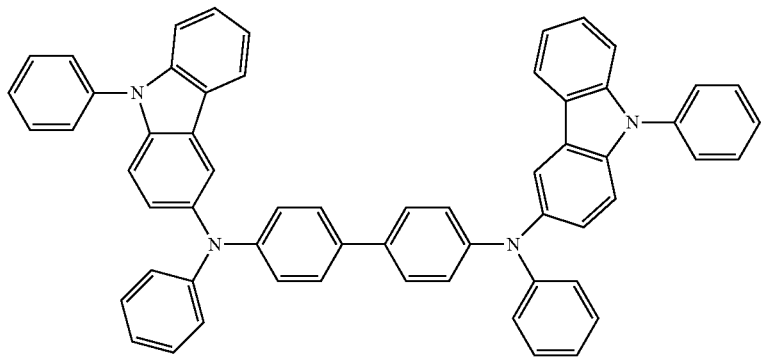

Formula (14)

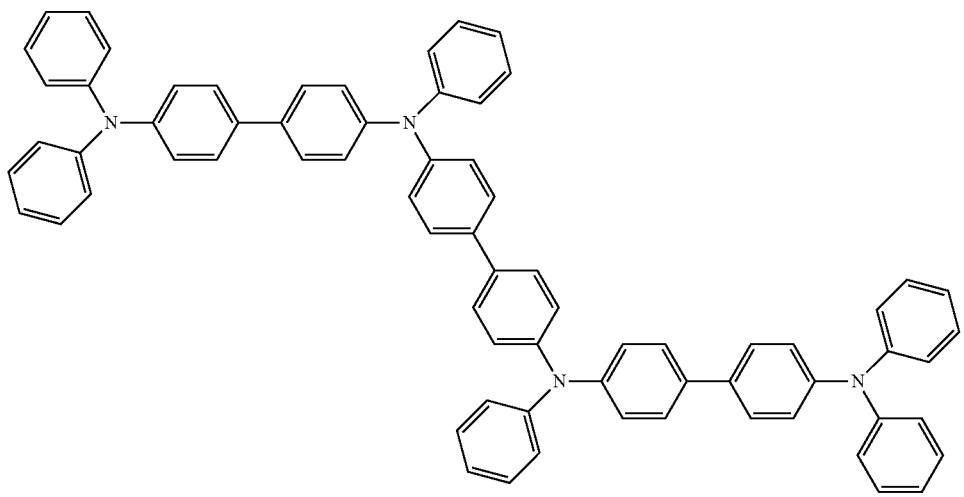

Formula (15)

In a preferred embodiment, the organic p-type material is a polymer.

In the present invention the term polymer referred to as including polymeric compounds, oligomeric compounds and dendrimeric compounds. Polymeric compounds preferably comprise 10 to 10000, more preferably 20 to 5000 and most preferred 50 to 2000 structural units (repeating units). The oligomeric compounds according to the invention preferably comprise 3 to 9 structural units. The branching factor of the polymers is in-between 0 (linear polymer, without branching points) and 1 (completely branched dendrimer). The polymer is preferably a polymer having a molecular weight ($M_W$) in the range of from 200000 to 300000 g/mol. The determination of $M_W$ can be performed according to standard techniques known to the person skilled in the art by employing gel permeation chromatography (GPC) with polystyrene as internal standard, for instance.

The term "dendrimer" in the present invention is referred to as a highly branched compound being composed of a multifunctional core to which branched monomers are bound in a regular manner so that a tree-like structure is obtained. Thereby the centre and/or the monomers may be branched in various ways. The term "dendrimer" is herein referred to as defined in M. Fischer and F. Vogtle (Angew. Chem., Int. Ed. 1999, 38, 885).

Generally, the polymeric organic p-type material comprises at least one repeating unit capable of transporting.

In a preferred embodiment, the polymeric organic p-type material comprises at least one repeating unit comprising an HTM and/or HIM unit as described above, but may also comprise two, three or more of them.

In a very preferred embodiment the p-type polymer is a conjugated copolymer of at least one hole transport repeating unit and at least one backbone repeating unit, i.e. the conjugated copolymer comprises two or more different repeating units. At least one of these units is a polymer backbone. At least one other of these units is a monomeric unit having hole transport property, which can be selected from group comprising an HTM or HIM unit as described above Preferably, the polymer backbone is selected from the unit of the general formula (16).

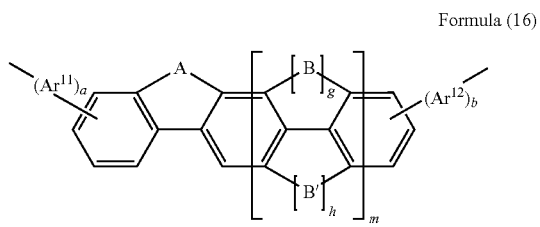

Formula (16)

wherein
A, B and B' are independently of each other, and in case of multiple occurrence independently of one another, a divalent group, preferably selected from —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$— and —$SiR^1R^2$—,
$R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached,
X is halogen,
$R^0$ and $R^{00}$ are independently of each other H or an optionally substituted carbyl or hydrocarbyl group optionally containing one or more hetero atoms,
each g is independently 0 or 1 and each corresponding h in the same subunit is the other of 0 or 1,
m is an integer ≥1,
$Ar^{11}$ and $Ar^{12}$ are independently of each other mono- or polynuclear aryl or heteroaryl that is optionally substituted and optionally fused to the 7,8-positions or 8,9-positions of the indenofluorene group,
a and b are independently of each other 0 or 1.

Very preferred are units of formula (16) wherein the groups $R^1$ and $R^2$ form a spiro group with the fluorene group to which they are attached.

If in the units of formula (16) the groups $R^1$ and $R^2$ form a spiro group with the fluorene group to which they are attached, it is preferably spirobifluorene.

Preferably the units of formula (16) are selected from the group consisting of the following subformulae:

Formula (16 a)

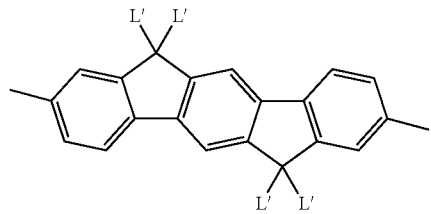

Formula (16 b)

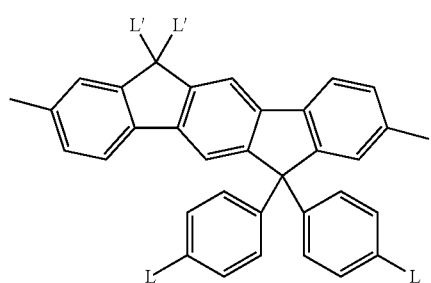

Formula (16 c)

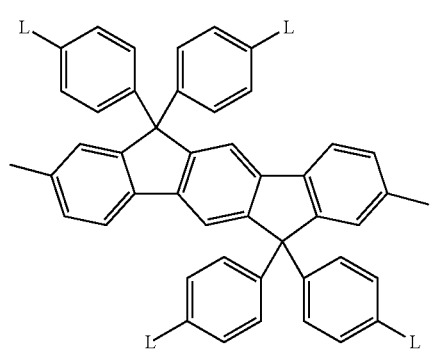

Formula (16 d)

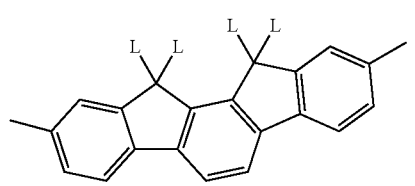

wherein

L is selected from H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

Further preferred backbone units are those of phenanthrene derivatives as disclosed for example in WO 2005/104264 A1, very preferably phenanthrenes with the following formulae Formula (17)

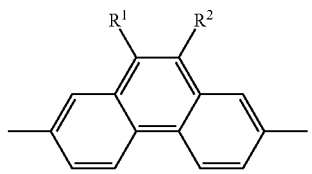

Formula (18)

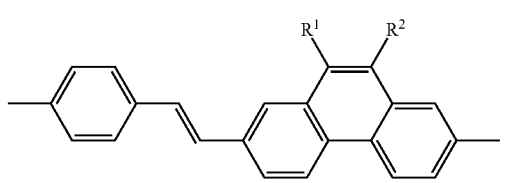

wherein $R^1$ and $R^2$ are as defined above for compound of formula (16), and are preferably alkyl or alkoxy with 1 to 12 C atoms or aryl or heteroaryl with 5 to 12 C atoms that is optionally substituted.

Further preferred backbone units are those of dihydrophenanthrene derivatives as disclosed for example in DE 10337346A.

Further preferred backbone units are those as disclosed for example in WO 2003/099901A1.

Further preferred backbone units are selected from fluorene derivatives, as disclosed for example in U.S. Pat. No. 5,962,631, WO 2006/052457 A2 and WO 2006/118345A1, spiro-bifluorene derivatives as disclosed for example in WO 2003/020790 A1, benzofluorene, dibenzofluorene, benzothiophene, dibenzofluorene and their derivatives as disclosed for example in WO 2005/056633A1, EP 1344788A1 and WO 2007/043495A1

The copolymer may be statistical or random copolymers, alternating or regioregular copolymers, block copolymers or combinations thereof. They may comprise two, three or more distinct monomer units.

Preferably the p-type conjugated polymer comprises, in addition to the backbone unit, one or more HTM units selected from formula (19):

Formula (19)

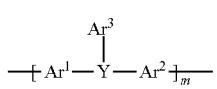

wherein

Y is N, P, P=O, $PF_2$, P=S, As, As=O, As=S, Sb, Sb=O or Sb=S, preferably N, $Ar^1$ which may be the same or different and denotes, independently if in different repeat units, a single bond or an optionally substituted mononuclear or polynuclear aryl group, $Ar^2$ which may be the same or different and denotes, independently if in different repeat units, an optionally substituted mononuclear or polynuclear aryl group, $Ar^3$ which may be the same or different and denotes, independently if in different repeat units, an optionally substituted mononuclear or polynuclear aryl group, m is 1, 2 or 3.

Particularly preferred units of formula (19) are selected from the group consisting of the following subformulae:

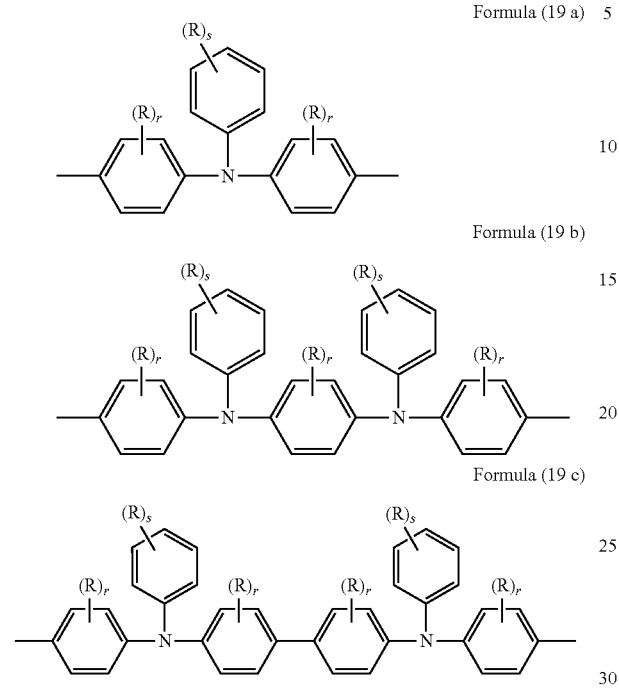

Formula (19 a)

Formula (19 b)

Formula (19 c)

wherein
R which may be the same or different in each occurrence, is selected from H, substituted or unsubstituted aromatic or heteroaromatic group, alkyl, cycloalkyl, alkoxy, aralkyl, aryloxy, arylthio, alkoxycarbonyl, silyl, carboxy group, a halogen atom, cyano group, nitro group or hydroxy group,
r is 0, 1, 2, 3 or 4, and
s is 0, 1, 2, 3, 4 or 5.

The units of formula (19) serve as hole transport unit.

In another preferred embodiment, the p-type conjugated polymer comprises, in addition to the backbone unit, one or more HTM units selected from formula (20):

-(T$^1$)$_c$-(Ar$^4$)$_d$-(T$^2$)$_e$-(Ar$^5$)$_f$—   Formula (20)

wherein
T$^1$ and T$^2$ are independently of each other selected from thiophene, selenophene, thieno[2,3b]thiophene, thieno[3,2b] thiophene, dithienothiophene, pyrrole, aniline, all of which are optionally substituted with R$^5$,
R$^5$ is in each occurrence independently of each other selected from halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally contains one or more hetero atoms,
Ar$^4$ and Ar$^5$ are independently of each other mononuclear or polynuclear aryl or heteroaryl, which is optionally substituted and optionally fused to the 2,3-positions of one or both of the adjacent thiophene or selenophene groups,
c and e are independently of each other 0, 1, 2, 3 or 4, with 1<c+e≤6,
d and f are independently of each other 0, 1, 2, 3 or 4.

The repeating units of formula (20) are preferably selected from the following formulae:

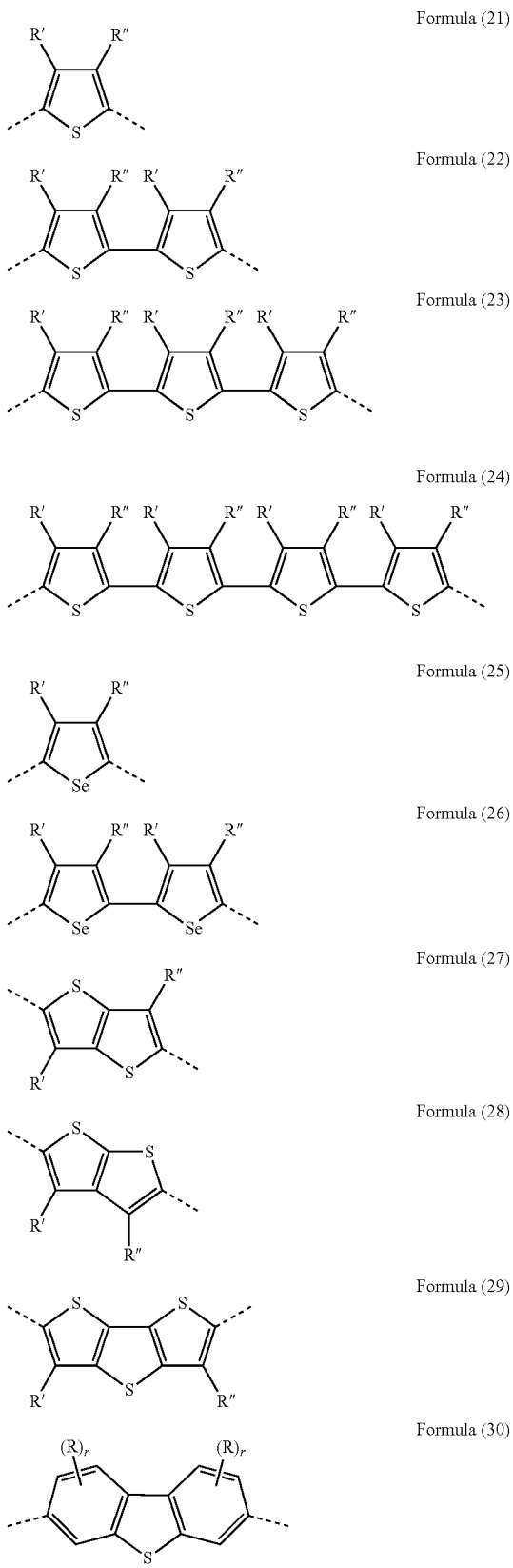

Formula (21)

Formula (22)

Formula (23)

Formula (24)

Formula (25)

Formula (26)

Formula (27)

Formula (28)

Formula (29)

Formula (30)

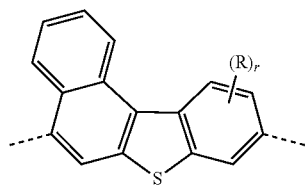

Formula (31)

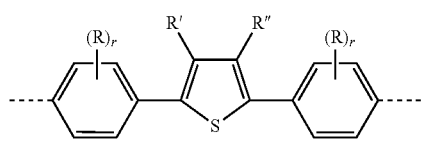

Formula (32)

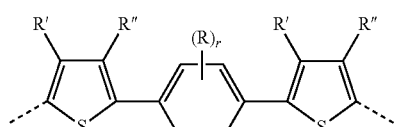

Formula (33)

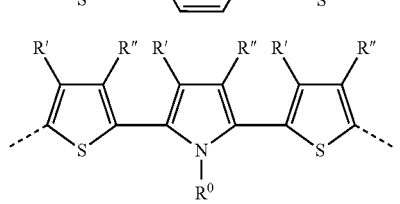

Formula (34)

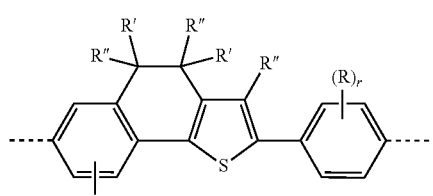

Formula (35)

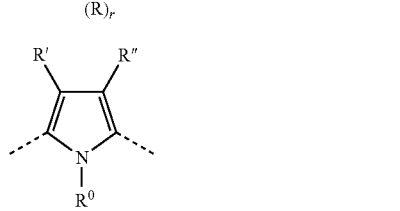

Formula (36)

wherein R', R" and R have in case of multiple occurrence independently of one another one of the meanings of $R^1$ in formula (16), and r is 0, 1, 2, 3 or 4.

R' and R" in formulae (21) to (24) are preferably different from H and n-alkyl, and are preferably linear or branched alkoxy, thioalkyl or fluorinated alkyl with 1 to 22 C-atoms.

The copolymer of the present invention may be a statistical, random, alternating, regioregular or block copolymer or any combination thereof. It may comprise two, three or more distinct monomer units.

The copolymer of the present invention may be a conjugated, or a partially conjugated, or non-conjugated polymer.

In a preferred embodiment, the content of backbone repeating units, for example according to formula (16), in the copolymer is preferably larger than 5 mol % and smaller than 100 mol %, particularly preferably in the range between 20 and 80 mol %, very particularly preferably between 40 and 60 mol %.

The content of HTM repeating units as described above, preferably the units according to formulae (19) and/or (20), in the copolymer is preferably larger than 5 mol % and smaller than 100 mol %, particularly preferably in the range between 20 and 80 mol %, very particularly preferably in the range between 40 and 60 mol %.

The copolymer is preferably a conjugated or partially conjugated polymer, comprising a segment having following formula $$[-(-A-)_x-(-B-)_y-]_n$$  Formula (37)

wherein x and y denote the molar ratio of the monomeric units,

A is a backbone unit as defined above, for example of formula (16),

B is an HTM unit, for example of formula (19) or (20) as defined above, x is larger than 0.05 and smaller than 1, y is larger than 0 and smaller than 0.95, x+y is 1, n is an integer larger than 1.

In a preferred embodiment, the HTM repeating unit B in formula (37) is selected from formulae (19a) to (19c) and formulae (21) to (36), and backbone unit A in formula (37) is selected from:

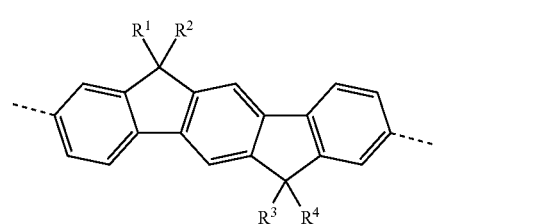

Formula (38)

Formula (39)

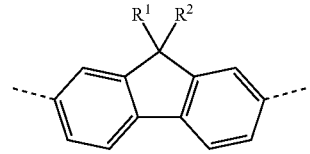

Formula (40)

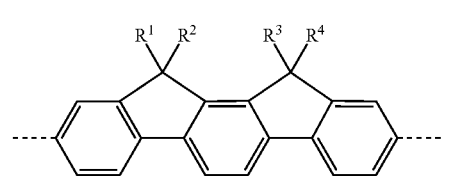

Formula (41)

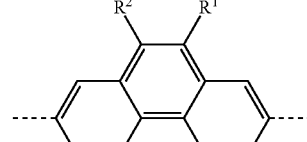

Formula (42)

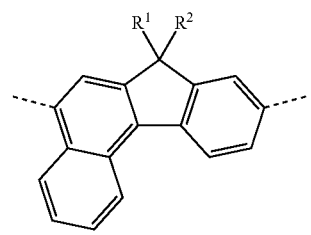

-continued

Formula (43)
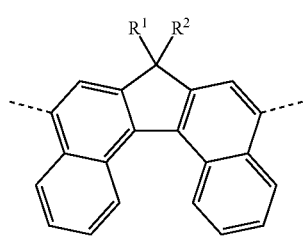

Formula (44)
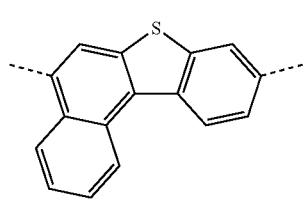

Formula (45)
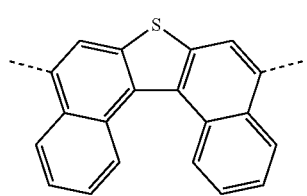

Formula (46)
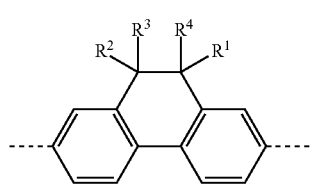

Formula (47)
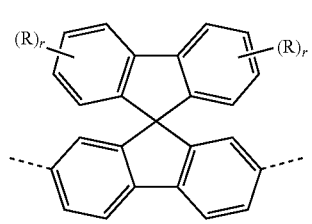

wherein $R^{1,2}$, R, and $R^3$ and $R^4$ are independently of each other have one of the meanings given for $R^1$ in formula (16), and r is an integer ≤4.

In the copolymer of formula (37), very preferably 0.4<x<0.6 and 0.6<y<0.4, most preferably x=y=0.5.

In a further embodiment, the p-type copolymer can be a copolymer consisting only backbone units, or HTM or HIM units, e.g. in formula (37), both A and B are selected from the same class of the repeating unit, for example the backbone units, the HTM units as described above. In a preferred embodiment, the p-type polymer is a homopolymer, comprising the repeating unit according to formulae (16) to (20).

In a certain embodiment, the organic p-type material can be a non-conjugated polymer comprising at least one HTM unit.

In one embodiment, the said organic p-type material is a non-conjugated side-chain polymer, which comprises at least one HTM or HIM unit and yet preferably at least one further functional unit selected from backbone unit as described above. In general, such p-type polymer may be obtained by means of radical copolymerization of vinyl compounds, and includes at least one HTM or HIM. The examples for such kind of polymers and their syntheses can be referred to U.S. Pat. No. 7,250,226 B2, JP 2007/211243 A2, JP 2007/197574 A2, U.S. Pat. No. 7,250,226B2, JP 2007/059939A.

In yet another embodiment, the said organic p-type material may be a non-conjugated main-chain polymer, also referred to herein as non-conjugated backbone polymer, which comprises at least one HTM or HIM repeating unit as described above and at least one of A in formula (37) is non-conjugated backbone unit.

The said non-conjugated backbone unit can be selected from groups comprising linear or hyperbranched alkylene, cycloalkylene, alkylsilylene, silylene, arylsilylene, alkylalkoxyalkylene, arylalkoxyalkylene, alkylthioalkylene, sulfone, alkylensulfone, sulfonoxide, alkylensulfonoxide, wherein alkylene group in each occurrence can independently from each other have 1 to 12 C-atoms and wherein one or more H atoms can be substituted by F, Cl, Br, I, alkyl-, heteroalkyl-, cycloalkyl-, aryl-, and heteroaryl-group.

Particular preference is given to A being a linear or branched alkylene or alkoxyalkylene with 1 to 12 C-atoms, wherein one or more of the H-atoms can be substituted with F.

The preferred non-conjugated backbone unit is selected from a unit comprising indenofluorene derivatives, as for example in the following formulae as disclosed in DE 02009023156.0

Formula (48)
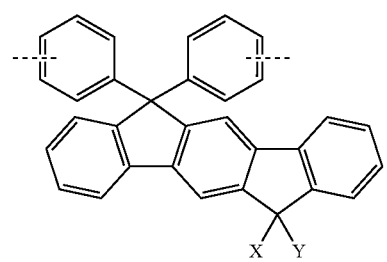

Formula (49)
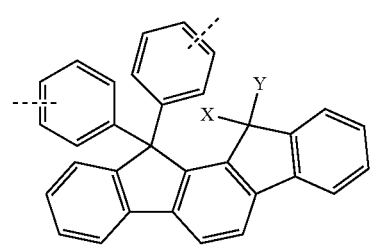

wherein X and Y are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

Further preferred non-conjugated backbone unit is selected from a unit comprising fluorene, phenanthrene, dehydrophenanthrene, indenofluorene derivatives, as for example in the following formulae as disclosed in DE 102009023154.

Formula (50)
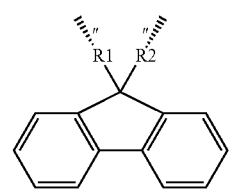

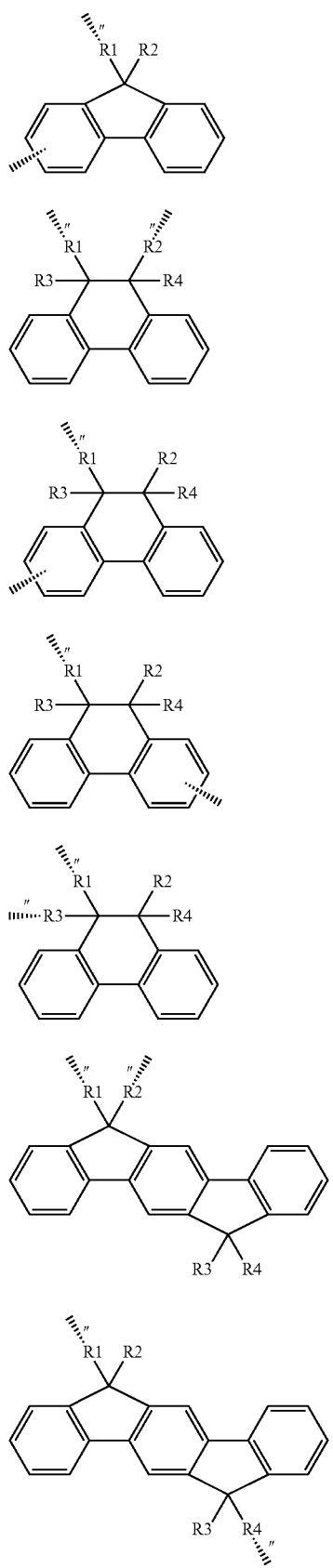

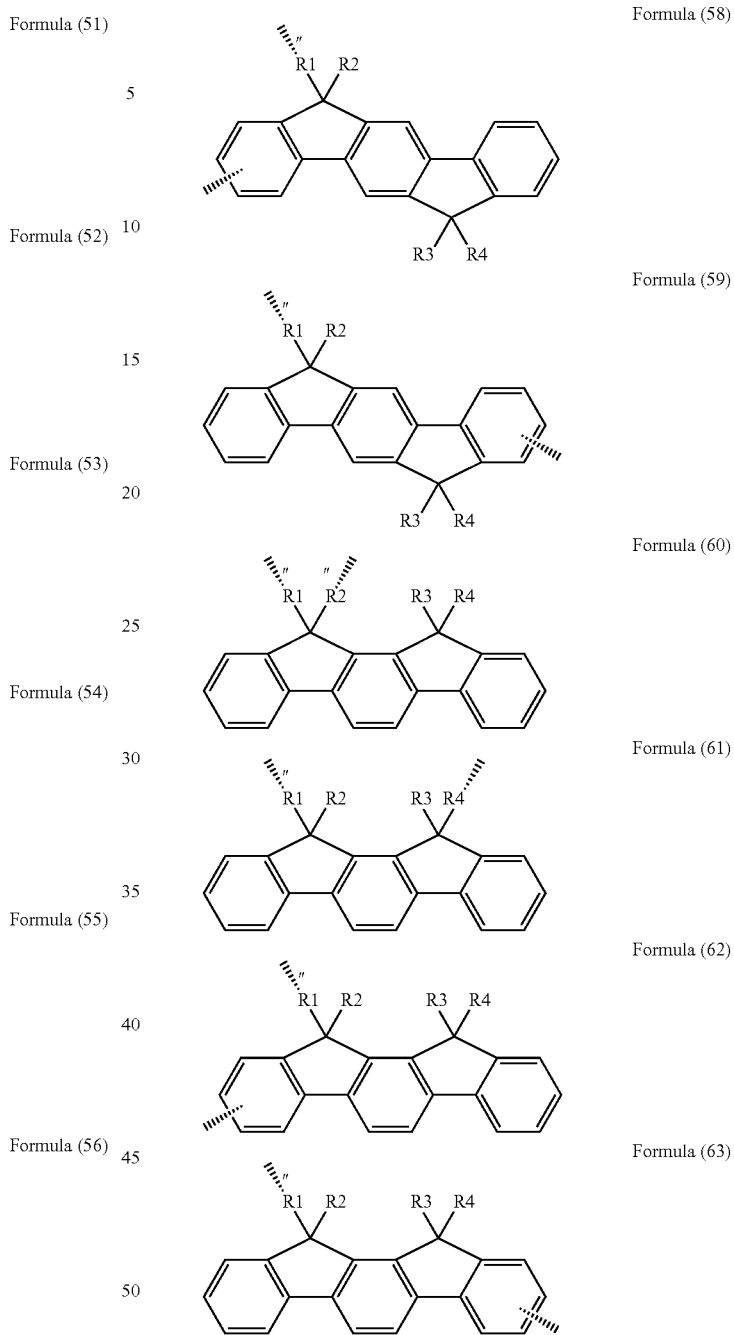

wherein $R^1$ to $R^4$ are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

In the above mentioned repeating units the dotted line, the binding without substituent or the binding to the star indicates the bond to the other monomer units in the copolymer.

The thickness of the p-type layer is preferably in the range of 1 to 1000 nm, more preferred in the range of 2 to 500 nm, most preferred in the range of 10 to 200 nm.

In the electronic devices according to the invention the n-type layer may comprises an inorganic or an organic n-type material.

In case of the first embodiment, wherein both n- and p-type layers are in direct contact, the following further arrangements are preferred to ensure separation of electron and/or hole transport channel. In one preferred embodiment, the n-type material has a valence band (or HOMO) level lower than −5.5 eV, more preferably lower than −6.0 eV. In another preferred embodiment, the valence band (or HOMO) level of n-type materials in n-type layer is at least 0.3 eV lower than that of p-type material in p-type layer. In yet another preferred embodiment, the conduct band (or LUMO) level of n-type materials in n-type layer is at least 0.4 eV higher than the valence band (or HOMO) level of p-type material in p-type layer.

In a particularly preferred embodiment, the n-type layer comprises at least one n-type inorganic semiconductor.

The inorganic n-type semiconductor material can be selected from a metal oxide, a Chalcogenide, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include TiO, ZnO, ZnS, ZnSe, ZnTe, CdO, CdS, CdSe, CdTe, MgS, MgSe, $SnO_2$, $Ga_2O_3$, GaAs, GaN, GaP, GaSe, GaSb, HgO, HgS, HgSe, HgTe, $In_2O_3$, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In a preferred embodiment, the inorganic n-type material is selected from metal oxides, group IV, group III-V, group IV-VI and group II-VI semiconductors, an alloy including any of the foregoing, and/or a mixture including any of the foregoing, including ternary and quaternary mixtures or alloys. Preferred metal oxides include, but not limit, ZnO, $In_2O_3$, $Ga_2O_3$, $MoO_3$, $TiO_2$, $SnO_2$, and their alloys $SnO_2$:Sb, $In_2O_3$:Sn (ITO), ZnO:Al, a-Zn—Sn—O, a-In—Zn—O, a-IGZO (such as $InGaZnO_4$, $In_2Ga_2ZnO_7$, $InGaZnO_x$) etc.

The inorganic n-type layer can be deposited by any suitable method, which includes physical vapor deposition, e-beam and solution-based processing.

In a preferred embodiment, the inorganic n-type layer is formed by a solution based processing, more preferably by coating a precursor compound of n-type material on the substrate and heating the precursor to obtain a film of the n-type material on the substrate. The maximum of the heating temperature is preferably less than 400° C., more preferably less than 300° C. and most preferably less than 250° C. from the point of being able to coat a thin film to a flexible substrate. Sometimes, the transformation of the precursor to the n-type material can be enhanced by radiation UV-light to the applied coating of the precursor.

ZnO is the one of the most preferred n-type material for the present invention, due to its richness in the earth's crust, easy processibility, and excellent stability. Suitable organometallic precursor compounds for ZnO include, without limitation, zinc acetylacetonate, zinc formate, zinc hydroxide, zinc chloride, zinc nitrate, their hydrates, and the like. Preferably, the organometallics precursor compound is a zinc salt of a carboxylic acid or a hydrate thereof, more preferably zinc acetate or a hydrate thereof. Optional doping materials can include, for example, aluminum nitrate, aluminum acetate, aluminum chloride, aluminum sulfate, aluminum formate, gallium nitrate, gallium acetate, gallium chloride, gallium formate, indium nitrate, indium acetate, indium chloride, indium sulfate, indium formate, boron nitrate, boron acetate, boron chloride, boron sulfate, boron formate, and their hydrates.

WO 2009/010142 discloses ZnO precursors, their use and processing for thin film transistors.

WO 2010/078907 discloses precursors for various metal oxide, wherein the metal includes Zn, Ag, Pd, Rh, Cu, Pt, Ni, Fe, Ru, Os, Mn, Cr, Mo, Au, W, Co, Ir and Cd.

Further examples for precursor compounds are, titanium butoxide for $TiO_2$, and the precursor compounds for ZnO, $In_2O_3$, $Ga_2O_3$ as reported by Banger et al., in Nature Materials, 2010, Vol 10, 45.

Some precursor compounds are commercially available, for example $Zn(C_2H_3O_2)_2$ (Aldrich), and the precursor for $TiO_2$ (Dupont tyzol BTP).

In certain embodiment, Si may also be included in the n-type layer of the present invention. Si can also be formed by coating the precursor compound from solution, as reported by Shimoda et al., in Nature, 2006, vol 440, 783. The disclosures of the paper are hereby incorporated herein by reference in its entirety. The precursor compounds for Si are typically hydrogenated silicon compounds either of the straight-chain ($Si_nH_{2n+2}$) or cyclic ($Si_nH_{2n}$) forms. For n≥3, these compounds are liquid at room temperature and decompose to form a-Si when heated to 300° C. or higher.

The thickness of the n-type layer is preferably in the range of 1 to 200 nm, more preferred in the range of 5 to 100 nm, and very preferred in the range of 5 to 50 nm.

In another embodiment, the n-type layer ((1) or (2)) may comprise an organic n-type material. In principle, any organic electron transport material (ETM) or electron injection material (EIM) known in the field of organic light emitting diodes can be used in the device of present invention. Furthermore, fullerenes, such as C60 fullerene, graphene and carbon nanotubes and such kind of compounds summarized in Chem. Rev. (2007) 107 p1296 may be used as organic n-type material.

Preferred EIM are metal complexes of 8 hydroxyquinoline, such as, for example, $AlQ_3$ and $GaQ_3$.

Further EIMs includes heterocyclic organic compounds, such as, for example, 1,10-phenanthroline derivatives, benzimidazoles, thiopyran dioxides, oxazoles, triazoles, imidazoles or oxadiazoles, are likewise suitable. For examples of the use of five-membered rings containing N, such as, for example, oxazoles, thiazoles, oxadiazoles, thiadiazoles, triazoles, inter alia, see US 2008/0102311 A1.

Preferred EIMs are selected from compounds of the formulae (64) to (66), which may be substituted or unsubstituted.

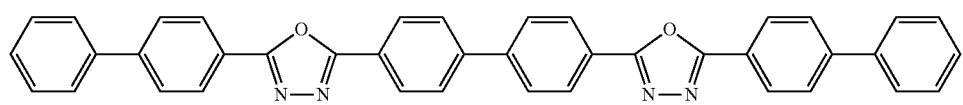

Formula (64)

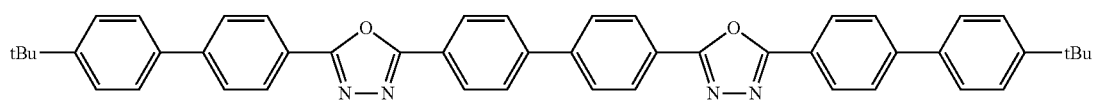

Formula (65)

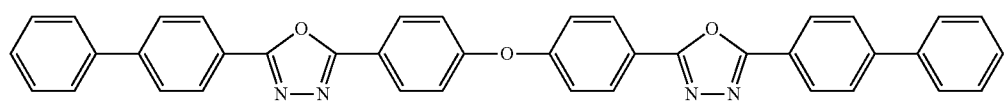

Formula (66)

Organic compounds, such as fluorenones, fluorenylidene methane, perylenetetracarboxylic acid, anthraquinone dimethanes, diphenoquinones, anthrones and anthraquinonediethylenediamines, can also be employed EIM, for example

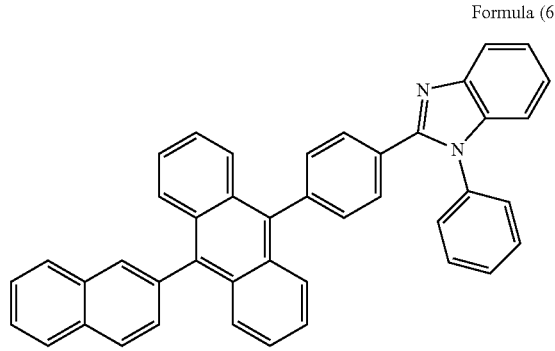

Formula (67)

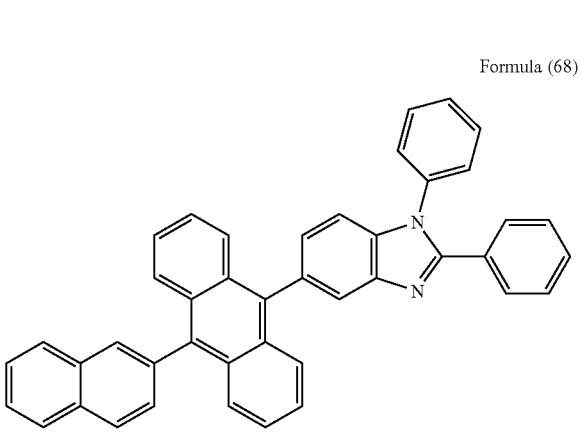

Formula (68)

1,10-phenanthroline derivatives (JP 2003-115387, JP 2004-311184, JP 2001-267080, WO 2002-043449), silacyl-cyclopentadiene derivatives (EP 1480280, EP 1478032, EP 1469533), pyridine derivatives (JP 2004-200162 Kodak), phenanthrolines, for example BCP and Bphen, also a number of phenanthrolines bonded via biphenyl or other aromatic groups (US 2007-0252517 A1) or phenanthrolines bonded to anthracene (US 2007-0122656 A1, e.g. formulae (71) and (72)), 1,3,4-oxadiazoles, for example formula (73), triazoles, for example formula (74), triarylboranes, for example also with Si, benzimidazole derivatives and other N heterocyclic compounds (cf. US 2007/0273272 A1), silacyclopentadiene derivatives, borane derivatives, Ga oxinoid complexes.

Preference is given to 2,9,10-substituted anthracenes (with 1 or 2 naphthyl and 4 or 3 biphenyl) or molecules which contain two anthracene units (US 2008/0193796 A1).

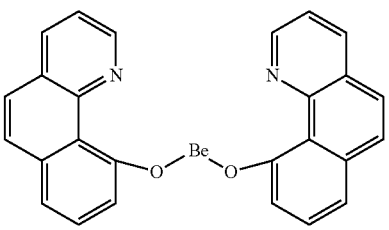

Formula (69)

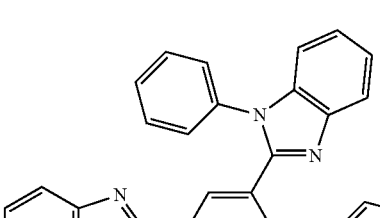

Formula (70)

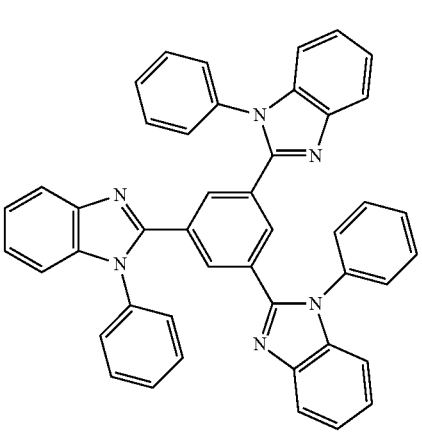

Suitable ETMs are metal chelates of 8 hydroxyquinoline (for example LiQ, AlQ$_3$, GaQ$_3$, MgQ$_2$, ZnQ$_2$, InQ$_3$, ZrQ$_4$), BalQ, 4 azaphenanthren-5-ol/Be complexes (U.S. Pat. No. 5,529,853 A; e.g. formula (69)), butadiene derivatives (U.S. Pat. No. 4,356,429), heterocyclic optical brighteners (U.S. Pat. No. 4,539,507), benzazoles, such as, for example, TPBI (U.S. Pat. No. 5,766,779, formula (70)), 1,3,5-triazines, pyrenes, anthracenes, tetracenes, fluorenes, spirofluorenes, dendrimers, tetracenes, for example rubrene derivatives, Formula (71)

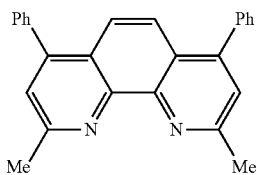

Formula (72)

Formula (73)

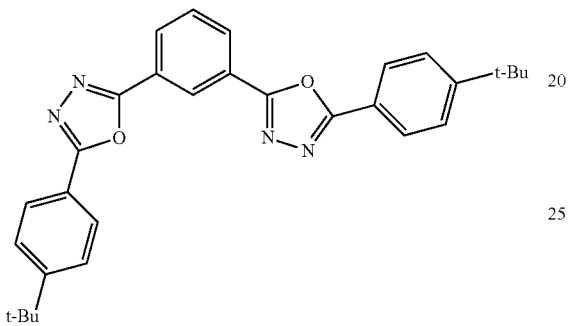

Formula (74)

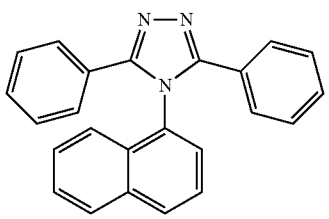

Preference is likewise given to anthracene-benzimidazole derivatives, such as, for example, the compounds of formulae (75) to (77), and as disclosed in, e.g., U.S. Pat. No. 6,878,469 B2, US 2006/147747 A, and EP 1551206 A1.

Formula (75)

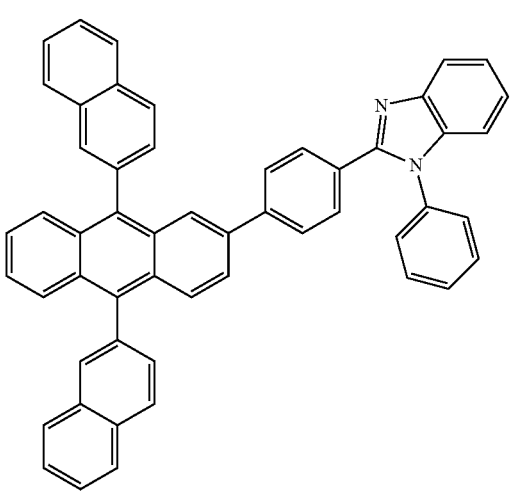

Formula (76)

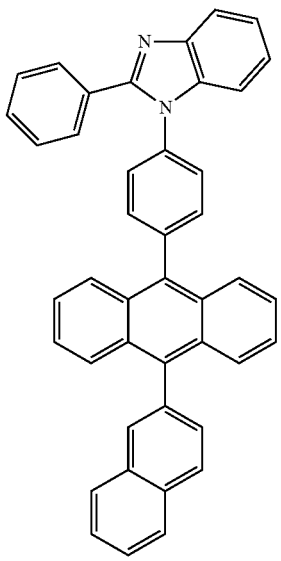

Formula (77)

The insulating layers A (6) and/or B (8) can comprise any insulating materials.

Preferably the insulating layer A (6) or B (8) comprises organic materials, and more preferably an organic materials which can be immobilized when light and/or heat is exposed to the materials. That is, the insulating layers are immobilizable by means of light exposure and/or heating. Such kind of materials are known by the person skilled in the art. It is especially preferred that the immobilizable material is an organic polymer bearing crosslinkable groups, which react with each other by exposing light or heat. A cross-linking group is a group comprising a cross-linking reagent, which leads to a cross-linking reaction with the help of heating, or radiation or both. The radiation source can be electron beam and UV light. The preferred UV light is selected from wavelengths from 200 to 400 nm. For an organic electronic device, UVA or a radiation from 300 to 400 nm is particularly preferred. The suitable UV source are for example mercury Ultraviolet fluorescent lamps, Ultraviolet LEDs, UV laser diodes and UV solid-state lasers Suitable cross-linkable groups are, for example, an acrylate group as disclosed for example by Scheler et al., in Macromol. Symp. 254, 203-209 (2007), a vinyl group or a styrene group as disclosed for example in WO 2006/043087 A1, and an oxetane group as disclosed by Mueller et al., in Nature 421, 829-833 (2003), and an azide group as disclosed for example in WO 2004/100282 A2.

The insulating layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In a further preferred embodiment, the insulting layer A (6) and/or B (8) comprises an inorganic insulating material, which can be metal oxides or mixed oxides or others, for example $SiO_x$, $SiN_x$, $AlO_x$, $ZrO_x$, $HfO_x$, $TiO_x$, wherein x is an integer between 1 and 4.

The thickness of the insulating layer A (6) and/or B (8) can vary from 1 nm to m, preferably from 5 nm to 0.5 m, very preferably from 50 nm to 0.5 m, particularly preferably from 100 nm to 0.5 m. The insulating layer may also be called dielectric layer.

Suitable electrode materials can be selected from all metals, preferably Al, Cu, Au, Ag, Mg, Fe, Co, Ni, Mn, Zn, Cr, V, Pd, Pt and their alloys, conductive oxide, for example ITO, AZO, ZnO etc., and conductive organic thin films comprising PEDOT:PSSH, PANi etc. The electrodes can be deposited by physical vapor deposition and printing methods. For example, the metals and metal oxide can be deposited by vacuum thermal evaporation, sputtering, e-beam etc; and metal oxide, conductive polymers can be deposited by printing methods. Some printable formulation for metals, conductive polymers are commercially available, for example nano-Ag ink by Advanced Nano Products Co., Ltd., CLEVIOS™ P VP Al 4083 by Heraeus Creavios GmbH.

The present invention further relates to a process of producing an electronic device according to the invention.

Generally, the process comprise the steps of, in the sequence,
1) Deposition of n-type layer ((1) or (2)).
2) Optionally, deposition of an insulating layer B (8) on the n-type layer ((1), (2))
3) Deposition of an organic p-type layer ((2) or (1)) on the insulation layer B (8).

The n-type inorganic layer, organic p-type layer ((1), (2)), and the insulating layer B (8), can be deposited either by a physical vapor deposition or a solution-based process. The suitable physical vapor deposition methods are known in one skilled in the art, including, vacuum thermal evaporation, cathodic arc deposition, e-beam deposition, pulsed laser deposition, and sputter deposition (incl. rf magnetron sputtering).

In a preferred embodiment, the n-type layer comprises inorganic n-type semiconductor, which can be preferably selected from metal oxides. In a very preferred embodiment, the deposition of the n-type metal oxide layer comprises the following steps in the consequence:
1-1) coating a solution to the substrate, wherein the solution contains the precursor compound of an n-type inorganic semiconductor material to form a precursor layer.
1-2) transforming the precursor layer to inorganic n-type layer by heating and/or by applying UV-light.

The method for coating from solution can be selected, but not limited to, dip coating, spin coating, ink jet printing, letter-press printing, screen printing, doctor blade coating, roller printing, reverse-roller printing, offset lithography printing, flexographic printing, web printing, spray coating, brush coating or pad printing, slot-die coating. Ink-jet printing is particularly preferred as it allows high resolution pattern to be prepared without mask.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the solution should be first prepared in a suitable solvent. Solvents must fulfill the requirements stated above and must not have any detrimental effect on the chosen print head. Additionally, solvents should have boiling points >100° C., preferably >140° C. and more preferably >150° C. in order to prevent operability problems caused by the solution drying out inside the print head. Beside the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing the layers in the device of present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and the composition) preferably has a viscosity at 20° C. of 1 to 100 mPa·s, more preferably 1-50 mPa·s and most preferably 1 to 30 mPa·s.

The solutions can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

In the step 1-2), the transformation of the precursor to the n-type material, e.g. metal oxide is typically realized by decomposition of the precursor, which may occur with or without existing of water. The processing comprising a decomposition occurring with the help of water is a sol-gel process, or in other words through hydrolysis which is known to skilled one in the art. Further some advanced methods can also be applied in the present invention, for example the "sol-gel on chip, as reported by Banger et al., in Nature Materials, 2010, Vol10, 45, and "low temperature combustion" as reported by Kim et al., in Nature Materials, 2011, Vol10, 382. The disclosures of the papers are hereby incorporated herein by reference in their entireties.

The present invention further relates to the use of the electronic device according to the invention in an electronic equipment selected from an RFID or a backplane for a display, such as a liquid crystal display (LCD), display containing organic light emitting diodes (OLED), displays for electronic books or electronic papers.

The present invention is therefore further related to the electronic equipment comprising an electronic device according to the invention.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the following description of exemplary embodiments and drawings, which are given for illustration of the invention and are not intended to be limiting thereof.

Figure 1:
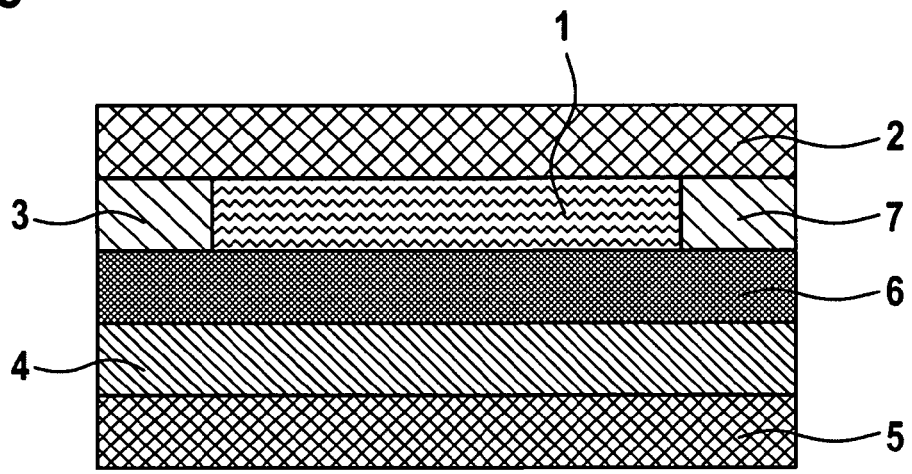
FIG. 1 shows an electronic device according to the first embodiment of the invention which is a bottom gate device. On the substrate (5) a first electrode (gate) (4) is located in the form of a layer. On the first electrode layer the insulating layer A (6) is arranged. On this insulating layer A (6) an n- (or p-) type layer (1) is deposited wherein on two opposite sides the second (source) (3) and the third electrode (drain) (7) are arranged each being in contact with the insulating layer A (6) and the n- and p-type layers (1 and 2). On the n- or p-type layer (1) another p- (or n-) type material layers (2) is arranged on the top of the device. One of the layers (1) and (2) is a n-type layer and the other is a p-type material layer. The two layers (1) and (2) together form the semiconductor body.
Figure 2:
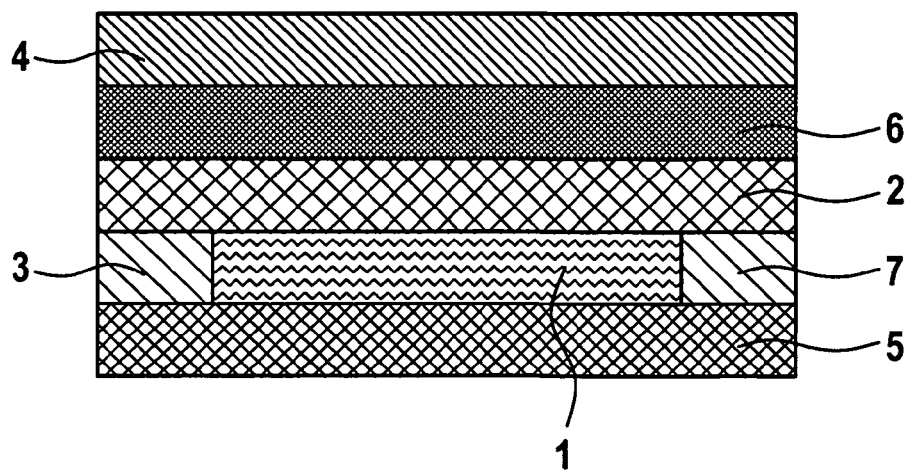
FIG. 2 shows an electronic device according to the first embodiment of the invention which is a top gate device. On the substrate (5) an n- (or p-) type layer (1) is deposited wherein on two opposite sides the second (source) (3) and the third electrode (drain) (7) are arranged each being in contact with the substrate (5) and the n- and p-type layers (1 and 2). On the n- (or p-) type layer (1) another p- (or n-) type material layers (2) is arranged on the top of the device. One of the layers (1) and (2) is a n-type layer and the other is a p-type material layer. The two layers (1) and (2) together form the semiconductor body. On the layer (2) of the semiconductor the insulating layer A (6) is arranged. On the insulating layer A (6) the first electrode (gate) (4) is located in the form of a layer on top of the device.
Figure 3:
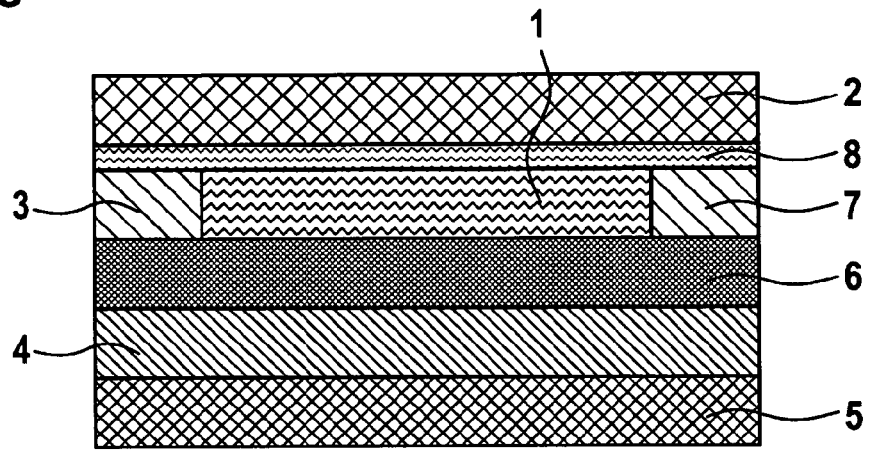
FIG. 3 shows an electronic device according to the second embodiment of the invention which is a bottom gate device. This device has a similar arrangement than the arrangement of the device shown in FIG. 1 with the only difference that between the layers (1) and (2) the insulating layer B (8) is located thereby physically separating both layers. The semiconductor thereby is referred to as comprising the layers (1), (2) and the insulating layer B (8).
Figure 4:
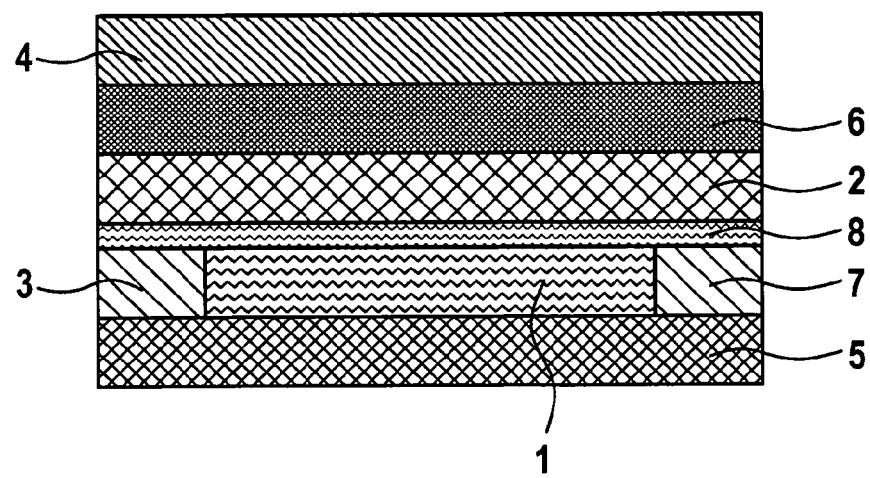
FIG. 4 shows an electronic device according to the second embodiment of the invention which is a top gate device. This device has a similar arrangement than the arrangement of the device shown in FIG. 2 with the only difference that between the layers (1) and (2) the insulating layer B (8) is located thereby physically separating both layers. The semiconductor thereby is referred to as comprising the layers (1), (2) and the insulating layer B (8).

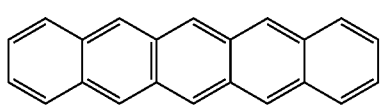
PEN
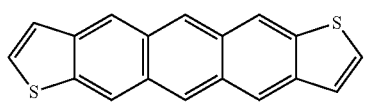
ADT
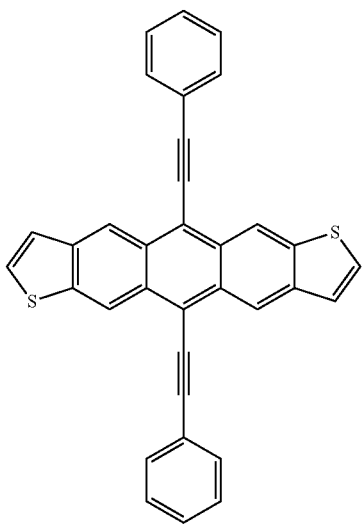
PE-ADT
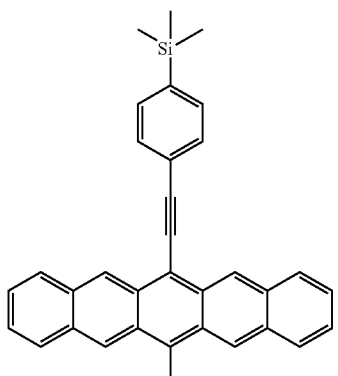
TESPE-PEN
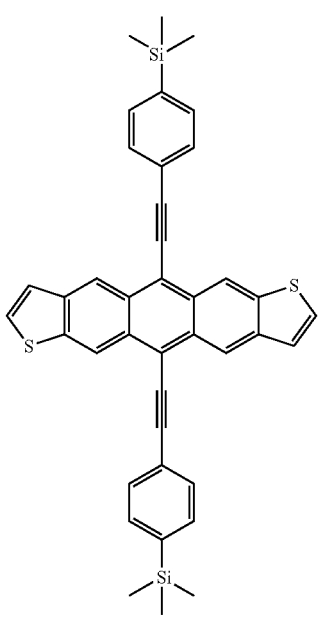
TESPE-ADT
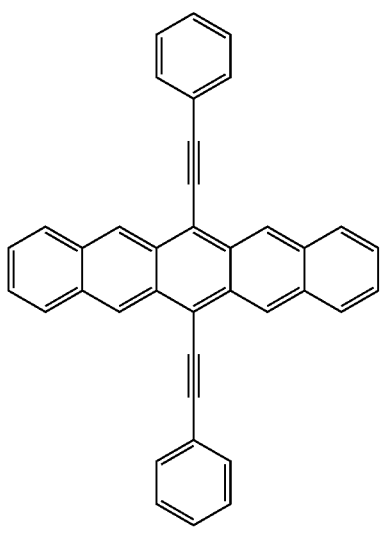
PE-PEN
WORKING EXAMPLES
Example 1
Materials and their Syntheses
The following p-type polymer is synthesized by employing the Suzuki coupling. The reaction can be carried out according to synthetic methods well known to the person skilled in the art. The method is described, for example, in WO 2003/048225.

Polymer P1, used as organic p-type material, is a copolymer comprising the following monomers (B1 and H1, wherein B stands for backbone unit and H for hole transport unit) with mol % as indicated:

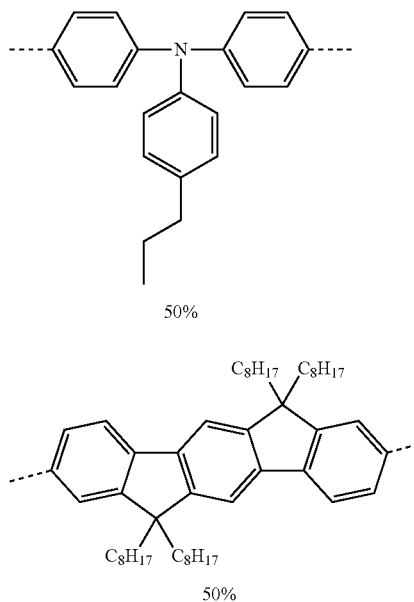

The molecular weight of the resulting polymer is distributed between 200000 to 300000 g/mol.

SHT-263 is a small molecular p-type material by Merck KGaA, and is soluble in common organic solvents, for example toluene, chlorobenzene.

The precursor for the n-type material, ZnO, is bis-[2-(methoxyimino)-propanoato]-zinc, which is synthesized as follows: Small parts of 22.94 g (120 mmol) tetraethylammonium bicarbonate are added under stirring to 20 ml aqueous solution of 5.28 g (60 mmol) 2-oxopropionic acid and 5.02 g (60 mmol) methoxyamine hydrochloride. After gas formation ended stirring is continued for 2 hours. 8.92 g (30 mmol) zinc nitrate hexahydrate was added. After 4 hours mixture was cooled to 5° C. White precipitation, filtered and recrystallized from hot water, yielded 5.5 g (56.7%).

Example 2

Quantum Chemical Calculations

In order to design a material for use in opto-electronic devices, the forecast of the energy levels, especially highest occupied molecular orbitals (HOMO) and lowest unoccupied molecular orbitals (LUMO) levels are essential.

Quantum chemical simulations on organic materials can be conducted in Gaussian 03W (Gaussian Inc.). For organic compounds comprising no metal, at first AM1 run is used to optimise molecular geometry, and TD-DFT (time-dependent density functional theory) with correction functional B3PW91 and basis set 6-31G(d) is used for energy calculations. For metal complexes comprising transition metals (incl. lanthanide and actinide), geometry optimisation is conducted using Hartree-Fock methodology with Basis Set "LanL2MB"; and the energy calculation is then conducted by using TD-DFT with correction functional B3PW91 and basis set 6-31G(d) for non-metal elements and Lanz2DZ (Los Alamos National Laboratory 2-double-z) for transition metals. Based on these calculations HOMO and LUMO energy levels can be obtained.

From the energy calculation one gets HOMO HEh and LUMO HEh in Hartree units. HOMO and LUMO values in electron volts can be determined according to the following equations, which are resulted from the calibration using cyclovoltametry (CV) measurements.

$$\text{HOMO (eV)} = ((\text{HEh} \ast 27.212) - 0.9899)/1.1206$$

$$\text{LUMO (eV)} = ((\text{LEh} \ast 27.212) - 2.0041)/1.385$$

These values can be used as HOMO-LUMO levels of the compounds in the present invention. As an example, for HTM1 (see also Table 1) a HOMO of −0.17454 Hartree and a LUMO of −0.0383 Hartree can be obtained from the calculation, which corresponds to a calibrated HOMO of −5.12 eV, and a calibrated LUMO of −2.20 eV.

For polymers, especially conjugated polymers, trimers of the polymer can be calculated. For example, for a polymer P1, the trimers B1-H1-B1 and/or H1-B1-H1 are used in calculation, wherein the polymerizable groups are removed and the long alkyl chains are reduced to methyl group. The correlation between experimental measurements and quantum chemical calculations of polymers in the way outlined herein is well accepted as disclosed WO 2008/011953 A1.

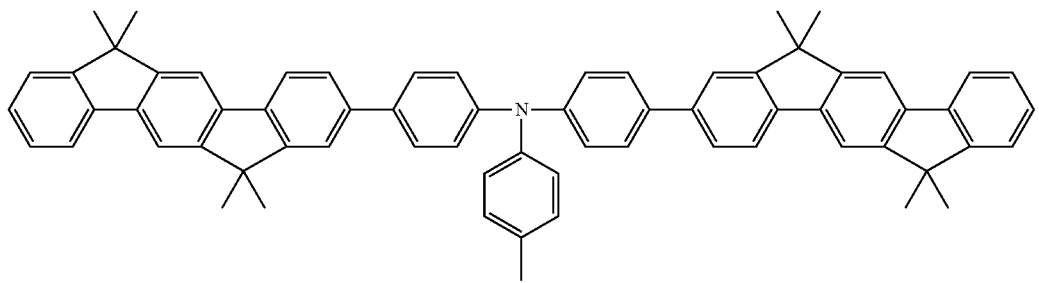

Trimer B1-H1-B1

In addition to P1, further soluble p-type organic materials, both small molecules and polymers as listed below can be calculated.

| | |
|---|---|
| B1 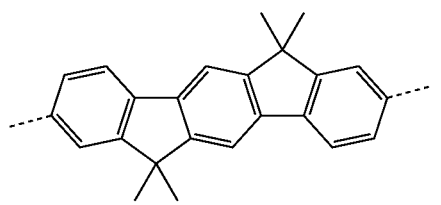 | B2 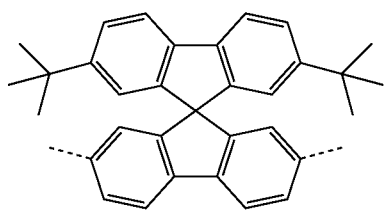 |
| B3 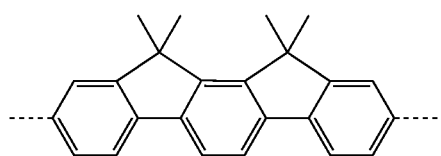 | B4 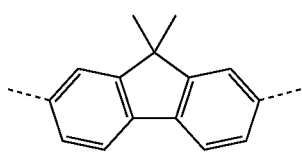 |
| B5 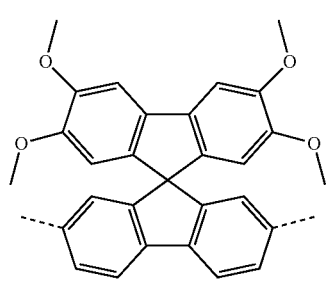 | B6 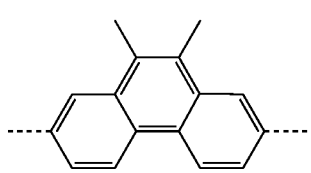 |
| 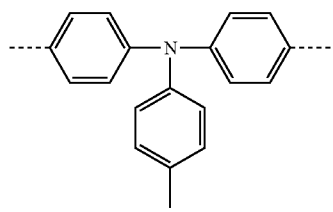 | H1 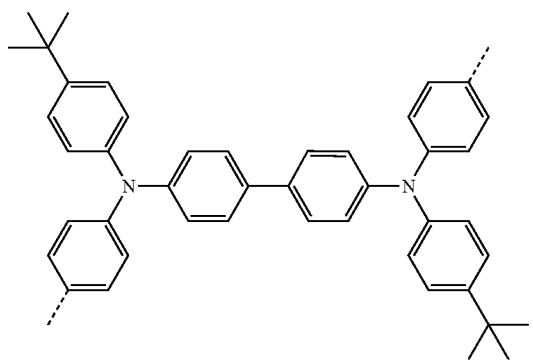 H2 |
| HTM1 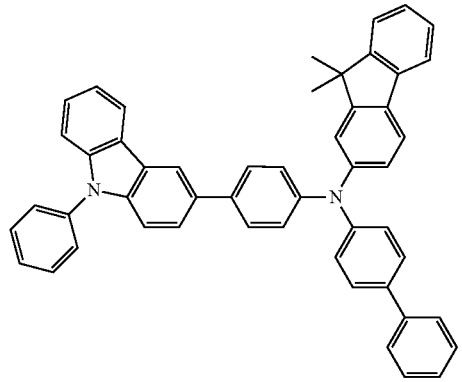 | HTM2 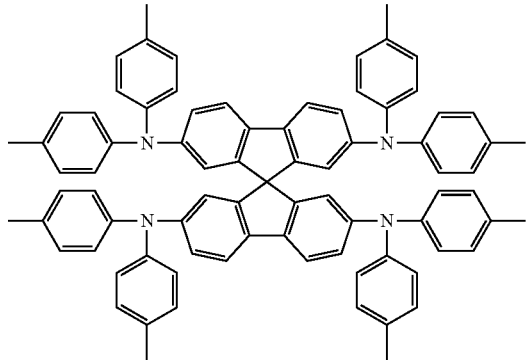 |

-continued
HTM3
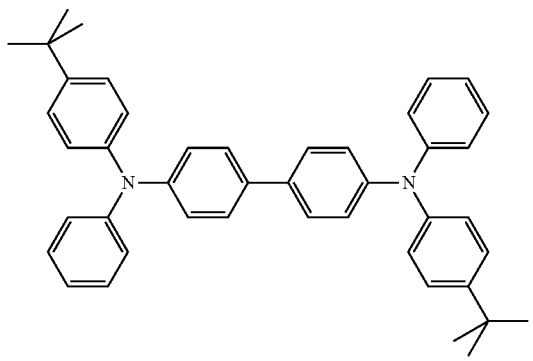
HTM4
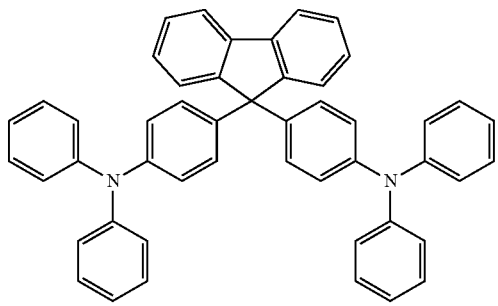
HTM5
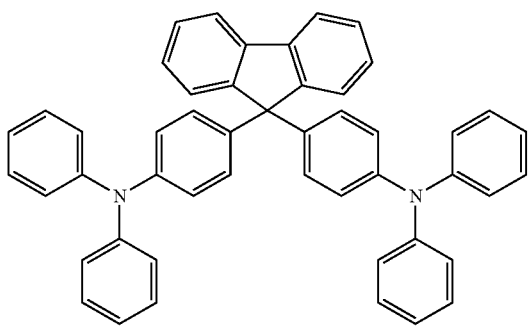
HTM7
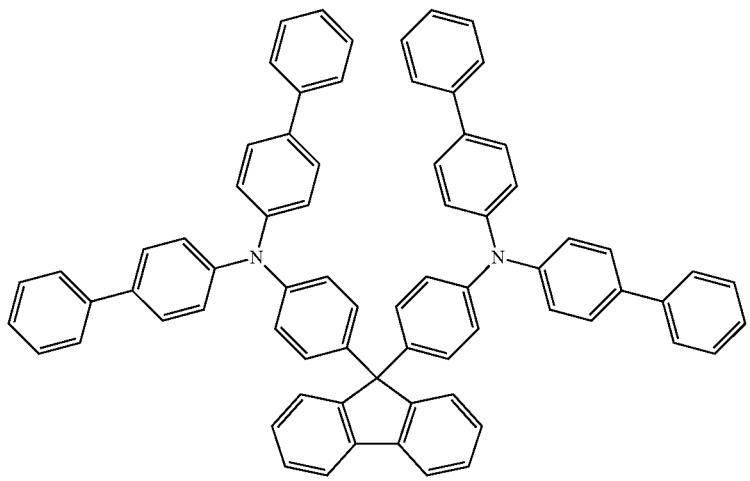
HTM6
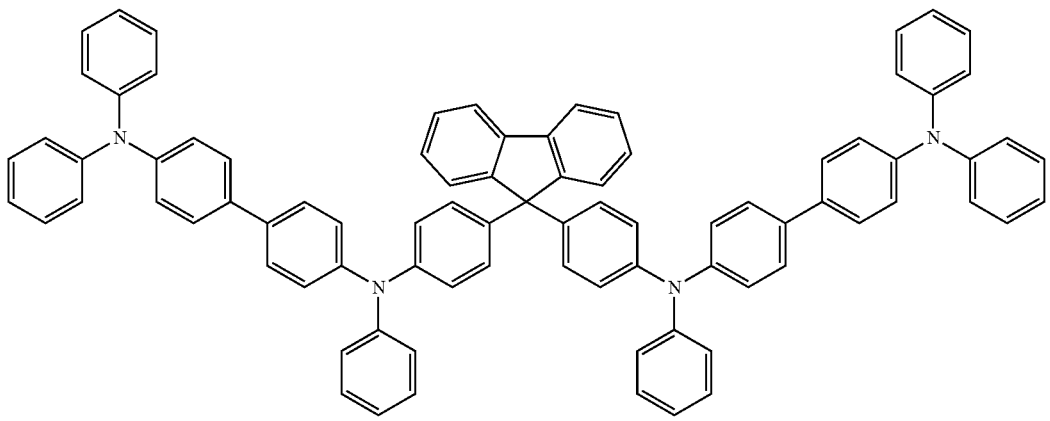

TABLE 1

| Structure | Class | Homo Corr. [eV] | Lumo Corr. [eV] |
|---|---|---|---|
| B1—H1—B1 | Polymer | −5.14 | −2.47 |
| B2—H1—B2 | Polymer | −5.14 | −2.34 |
| B3—H1—B3 | Polymer | −5.14 | −2.46 |
| B4—H1—B4 | Polymer | −5.16 | −2.34 |
| B5—H1—B5 | Polymer | −5.12 | −2.33 |
| B6—H1—B6 | Polymer | −5.21 | −2.34 |
| B1—H2—B1 | Polymer | −5.03 | −2.32 |
| B5—H2—B5 | Polymer | −5.07 | −2.32 |
| B6—H2—B6 | Polymer | −5.04 | −2.45 |
| HTM1 | SM | −5.12 | −2.20 |
| HTM2 | SM | −4.87 | −2.14 |
| HTM3 | SM | −5.23 | −2.09 |
| HTM4 | SM | −5.05 | −2.08 |
| HTM5 | SM | −5.25 | −2.16 |
| HTM6 | SM | −5.09 | −2.17 |
| HTM7 | SM | −5.23 | −2.20 |
| SHT-263 | SM | −4.74 | −2.05 |

Wherein, Bx-Hx-Bx means a trimer, which is included in a copolymer. Particularly perferably, the trimer means a copolymer consisting of 50 mol % Bx and 50 mol % Hx.

As shown in table 1, all of these materials have high LUMOs, thus can be used in the device according to the present invention.

Figure 6:
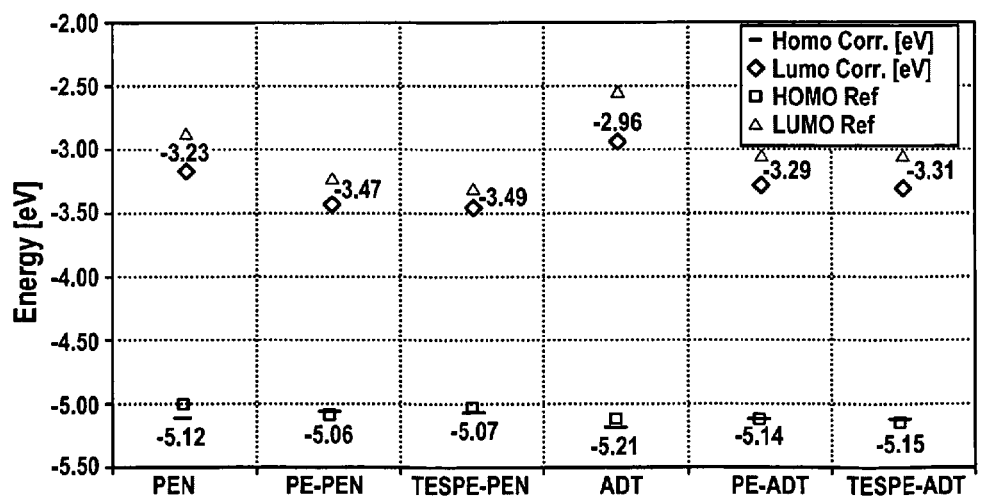
FIG. 6 shows the energy levels of some pentacene derivatives in comparison with the results reported by Kim et al. Organic Electronics 11 (2010) 1363, wherein the compounds have the following structures.

The same method can be used to calculate the HOMO and LUMO levels of the pentacene derivatives, as reported by Kim et al. Organic Electronics 11 (2010) 1363. The results are shown in FIG. 6, wherein "HOMO Ref" and "LUMO Ref" are taken from Organic Electronics 11 (2010) 1363, and "HOMO Corr" and "LUMO Corr" are calculated by the method described as above. It should be pointed out that 1) there is an excellent agreement between reported and calculated energy levels, especially for HOMO level; 2) all pentacene derivatives have quite low LUMO levels, almost all bellow −3.0 eV.

ZnO has a LUMO of −4.4 eV and HOMO of −7.7 eV, as reported in Adv. Funct. Mater. 2008, 18, 1832-1839

Example 3

Device Preparation and Characterization

The ambipolar TFTs can be prepared in two steps:

At first a ZnO TFT is prepared as follows: 75 μl of 3 wt % solution from 0.06 g 2-(methoxyimino)propanoatol-zinc-dihydrate and 1.94 g 2-methoxyethanol is spin-coated (2000 rpm, 30 s) at Si/SiO$_2$/Au substrate followed by 5 minutes Hoenle Fe-doped UV lamp (500 mW/cm$^2$) irradiation in air and 1 min. hot plate treatment at 325° C. in argon glove box (H$_2$O<0.5 ppm, O$_2$<0.5 ppm). The thickness of ZnO film is typically 20 to 50 nm.

Then the p-channel is formed on top of the ZnO film by spin-coating the solution of P1 or SHT-263 in toluene with a concentration of 5 mg/ml for P1 and 15 mg/ml for SHT-263. The thickness of the organic films varies from 20 to 50 nm.

The TFT characteristics were measured by Agilent B 1500 A. Typical ZnO TFT characteristics are mobility μ=0.8 cm$^2$/Vs, threshold voltage $V_{TH}$=6 V and on/off current ratio $I_{ON/OFF}$=10$^7$.

Figure 5:
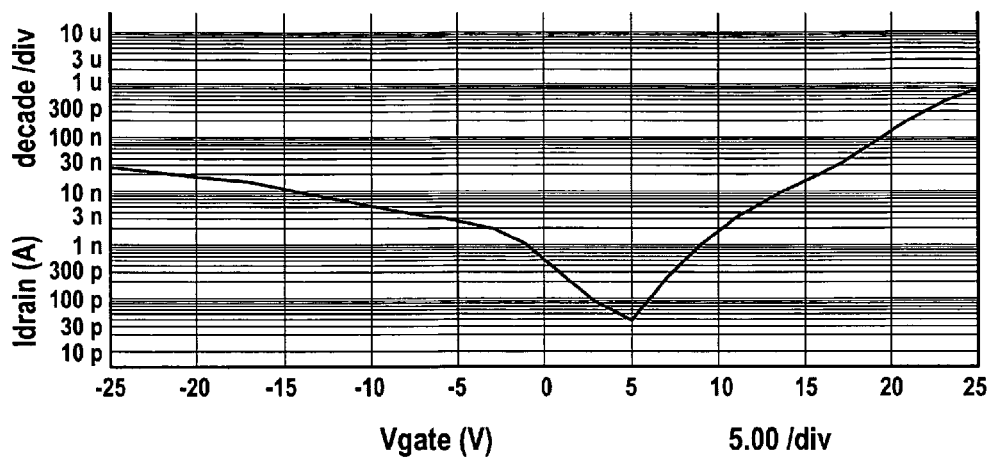
FIG. 5 shows one example of the output characteristic of the ambipolar field effect transistor consisting bilayer of ZnO/P1.

The ambipolar FETs, both with bilayer ZnO/P1 and ZnO/SHT263 shows clear ambipolar behavior. Typical output characteristics of the ambipolar field effect transistor consisting bilayer of ZnO/P1 is shown in FIG. 5.

The mobility of the n-channel is almost unchanged. The mobility of p-channel is listed in table 2.

TABLE 2

| FET | Mobility in p-channel | Max. On/off ratio |
|---|---|---|
| ZnO/P1 | 0.03 | >2 × 10$^3$ |
| ZnO/SHT263 | 2 × 10$^{-3}$ | >10$^3$ |

The invention claimed is:

1. An electronic device comprising arranged on a substrate (5):
    (a) a semiconductor body comprising a layer (1) which is either a n-type or a p-type layer, and a layer (2), which is either a n-type or a p-type layer, wherein one of both layers (1) and (2) is a n-type and the other one a p-type layer in which the p-type layer ((1) or (2)) comprises at least one organic hole transport material (HTM); and
    (b) a first electrode (4); and
    (c) an insulating layer A (6) interposed between the semiconductor body and the first electrode;
    (d) a second electrode (3) which is in contact with the semiconductor body; and
    (e) a third electrode (7) which is in contact with the semiconductor body but is detached from the second electrode;
    characterized in that
    (1) the n-type layer comprises an inorganic n-type semiconductor material and the said at least one organic hole transport material has a lowest unoccupied molecule orbital (LUMO) at an energy level higher than −2.7 eV; and/or
    (2) the semiconductor body further comprises an insulating layer B (8) interposed between the n-type layer and the p-type layer.

2. Electronic device according to claim 1, characterized in that the organic p-type layer and/or the organic n-type layer is coated from solution.

3. Electronic device according to claim 1, characterized in that the n-type layer comprises an inorganic n-type semiconductor material.

4. Electronic device according to claim 3, characterized in that the inorganic n-type semiconductor material is selected from metal oxides, group IV, group III-V, group IV-VI and group II-VI semiconductors.

5. Electronic device according to claim 3, characterized in that the inorganic n-type semiconductor material is a metal oxide, which is selected from ZnO, In$_2$O$_3$, SnO$_2$, TiO$_2$, Ga$_2$O$_3$, MoO$_3$ and an alloy or a mixture thereof.

6. Electronic device according to claim 3, characterized in that the inorganic n-type layer is formed by coating a precursor compound of the metal oxide on the substrate and heating the precursor to obtain a film of the metal oxide on the substrate.

7. Electronic device according to claim 1, characterized in that the thickness of the n-type layer is in the range of 1 to 200 nm.

8. Electronic device according to claim 1, characterized in that the organic p-type material comprises a group selected from amines, triaryl amines, thiophenes, carbazoles, indenocarbazoles, indolocarbazoles, phthalocyanines, porphyrines and derivatives thereof.

9. Electronic device according to claim 1, characterized in that the insulating layer B (8) comprises materials having a dielectric constant in the range of from 1.0 to 5.0.

10. Electronic device according to claim 1, characterized in that the insulating layer B (8) comprises a fluoropolymer, a perfluoropolymer and/or a metal oxide.

11. Electronic device according to claim 10, characterized in that the metal oxide is selected from the group consisting of $SiO_x$, $SiN_x$, $AlO_x$, $ZrO_x$, $HfO_x$, $TiO_x$, wherein x is an integer between 1 and 4.

12. Electronic device according to claim 1, characterized in that the thickness of the insulating layer B (8) is in the range of 1 nm to 1 μm.

13. An electronic equipment selected from an RFID and backplane for a display comprising an electronic device of claim 1.

14. Electronic equipment comprising an electronic device according to claim 1.

* * * * *